US012796450B2

(12) United States Patent
Huang

(10) Patent No.: US 12,796,450 B2
(45) Date of Patent: Nov. 10, 2026

(54) SEMICONDUCTOR DEVICE STRUCTURE WITH COMPOSITE INTERCONNECT STRUCTURE AND METHOD FOR PREPARING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 38 days.

(21) Appl. No.: 19/014,282

(22) Filed: Jan. 9, 2025

(65) Prior Publication Data

US 2025/0149451 A1 May 8, 2025

Related U.S. Application Data

(63) Continuation of application No. 17/881,843, filed on Aug. 5, 2022, now Pat. No. 12,438,088.

(51) Int. Cl.
*H10W 20/44* (2026.01)
*H10P 14/40* (2026.01)
(Continued)

(52) U.S. Cl.
CPC ....... *H10W 20/4451* (2026.01); *H10P 14/416* (2026.01); *H10P 30/40* (2026.01);
(Continued)

(58) Field of Classification Search
CPC ........... H10W 20/4451; H10W 20/435; H10W 20/048; H10W 20/063; H10W 20/0633;
(Continued)

(56) References Cited

U.S. PATENT DOCUMENTS

2004/0155269 A1* 8/2004 Yelehanka ......... H10D 84/0147 257/E21.507
2006/0194418 A1* 8/2006 Lee ......................... C30B 19/00 438/479
(Continued)

OTHER PUBLICATIONS

Office Action and and the search report mailed on Jun. 30, 2025 related to U.S. Appl. No. 18/208,487.
(Continued)

*Primary Examiner* — William B Partridge
*Assistant Examiner* — Chevy J Boegel
(74) *Attorney, Agent, or Firm* — Xuan Zhang

(57) ABSTRACT

A semiconductor device structure includes a first lower semiconductor structure disposed over a semiconductor substrate. The first lower semiconductor structure has a first sidewall and a second sidewall opposite to the first sidewall. The semiconductor device structure also includes a first upper semiconductor structure covering a top surface and the first sidewall of the first lower semiconductor structure. The first lower semiconductor structure and the first upper semiconductor structure include different materials. The semiconductor device structure further includes a first oxide portion disposed over the semiconductor substrate and extending along the second sidewall of the first lower semiconductor structure. The first oxide portion has an L-shape.

6 Claims, 22 Drawing Sheets

(51) Int. Cl.
*H10P 30/40* (2026.01)
*H10P 50/28* (2026.01)
*H10W 20/41* (2026.01)
*H10W 20/48* (2026.01)

(52) U.S. Cl.
CPC ......... *H10P 50/283* (2026.01); *H10W 20/435* (2026.01); *H10W 20/48* (2026.01)

(58) Field of Classification Search
CPC ........... H10W 20/031; H10W 20/0698; H10W 10/011; H10W 10/10; H10P 14/416; H10P 30/40; H10P 50/283; H10P 32/302
See application file for complete search history.

(56) References Cited

U.S. PATENT DOCUMENTS

| | | | | |
|---|---|---|---|---|
| 2012/0256266 | A1* | 10/2012 | Itou .................... | H10D 30/0227 257/E27.06 |
| 2015/0129969 | A1* | 5/2015 | Chuang .................. | H10B 10/00 438/275 |
| 2021/0375111 | A1 | 12/2021 | Huang | |
| 2021/0384195 | A1* | 12/2021 | Lu ........................ | H10B 12/315 |
| 2022/0223609 | A1 | 7/2022 | Loy et al. | |

OTHER PUBLICATIONS

Office Action and and the search report mailed on Mar. 3, 2025 related to U.S. Appl. No. 17/221,843, wherein this application is a CON of U.S. Appl. No. 17/221,843.
Office Action and and the search report mailed on May 20, 2025 related to U.S. Appl. No. 17/221,843, wherein this application is a CON of U.S. Appl. No. 17/221,843.

* cited by examiner

SEMICONDUCTOR DEVICE STRUCTURE WITH COMPOSITE INTERCONNECT STRUCTURE AND METHOD FOR PREPARING THE SAME

CROSS-REFERENCE TO RELATED APPLICATION

This application is a continuation application of U.S. Non-Provisional application Ser. No. 17/881,843 filed 5 Aug. 2022, which is incorporated herein by reference in its entirety.

TECHNICAL FIELD

The present disclosure relates to a semiconductor device structure and a method for preparing the same, and more particularly, to a semiconductor device structure with a composite interconnect structure and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first lower semiconductor structure disposed over a semiconductor substrate. The first lower semiconductor structure has a first sidewall and a second sidewall opposite to the first sidewall. The semiconductor device structure also first upper semiconductor structure covering a top surface and the first sidewall of the first lower semiconductor structure. The first lower semiconductor structure and the first upper semiconductor structure include different materials. The semiconductor device structure further includes a first oxide portion disposed over the semiconductor substrate and extending along the second sidewall of the first lower semiconductor structure. The first oxide portion has an L-shape.

In an embodiment, the first upper semiconductor structure is in direct contact with the top surface and the first sidewall of the first lower semiconductor structure. In an embodiment, the first lower semiconductor structure includes doped polysilicon. In an embodiment, the first upper semiconductor structure includes germanium (Ge). In an embodiment, the first oxide portion includes tetraethylorthosilicate (TEOS) oxide. In an embodiment, the semiconductor device structure further includes a dielectric layer disposed over the first oxide portion and surrounding the first upper semiconductor structure. The first lower semiconductor structure is separated from the dielectric layer by the first upper semiconductor structure and the first oxide portion.

In an embodiment, the semiconductor device structure further includes a second lower semiconductor structure disposed over the semiconductor substrate. The second lower semiconductor structure has a third sidewall facing the second sidewall of the first lower semiconductor structure and a fourth sidewall opposite to the third sidewall. In addition, the semiconductor device structure includes a second upper semiconductor structure covering a top surface and the third sidewall of the second lower semiconductor structure. The second lower semiconductor structure and the second upper semiconductor structure include different materials. In an embodiment, the second upper semiconductor structure is disposed over and in direct contact with the first oxide portion. In an embodiment, a portion of the second upper semiconductor structure is sandwiched between the second lower semiconductor structure and the first oxide portion. In an embodiment, the semiconductor device structure further includes a second oxide portion disposed over the semiconductor substrate and extending along the fourth sidewall of the second lower semiconductor structure, wherein the second oxide portion has an L-shape.

In another embodiment of the present disclosure, a semiconductor device structure is provided. The semiconductor device structure includes a first lower semiconductor structure disposed over a semiconductor substrate. The first lower semiconductor structure has a first sidewall and a second sidewall opposite to the first sidewall. The semiconductor device structure also includes a first upper semiconductor structure covering a top surface and the first sidewall of the first lower semiconductor structure. The first lower semiconductor structure and the first upper semiconductor structure include different materials. The semiconductor device structure further includes a first oxide portion disposed over the semiconductor substrate and extending along the second sidewall of the first lower semiconductor structure, and a dielectric layer disposed over the first oxide portion. The first oxide portion separates the dielectric layer from the semiconductor substrate.

In an embodiment, the first upper semiconductor structure is in direct contact with the top surface and the first sidewall of the first lower semiconductor structure, and the first oxide portion is in direct contact with the second sidewall of the first lower semiconductor structure. In an embodiment, the first lower semiconductor structure and the dielectric layer are separated by the first upper semiconductor structure and the first oxide portion. In an embodiment, the first lower semiconductor structure includes doped polysilicon, and the first upper semiconductor structure includes germanium (Ge). In an embodiment, a bottom surface of the first upper semiconductor structure is higher than a bottom surface of the first lower semiconductor structure. In an embodiment, the first oxide portion is in direct contact with the first upper semiconductor structure.

In an embodiment, the semiconductor device structure further includes a second lower semiconductor structure disposed over the semiconductor substrate. The second lower semiconductor structure has a third sidewall facing the second sidewall of the first lower semiconductor structure and a fourth sidewall opposite to the third sidewall. In addition, the semiconductor device structure includes a second upper semiconductor structure covering a top surface and the third sidewall of the second lower semiconductor structure, and a second oxide portion disposed over the semiconductor substrate and extending along the fourth sidewall of the second lower semiconductor structure. The second oxide portion is covered by the dielectric layer. In an embodiment, a material of the first oxide portion is the same as a material of the second oxide portion. In an embodiment, the first oxide portion is in direct contact with a bottom surface of the second upper semiconductor structure. In an embodiment, the first oxide portion is in direct contact with a sidewall of the second upper semiconductor structure.

In yet another embodiment of the present disclosure, a method for preparing a semiconductor device structure is provided. The method includes forming a first lower semiconductor structure over a semiconductor substrate. The first lower semiconductor structure has a first sidewall and a second sidewall opposite to the first sidewall. The method also includes depositing an oxide layer covering the first sidewall, the second sidewall, and a top surface of the first lower semiconductor structure. The method further includes performing an ion implantation process to form a first doped region in the oxide layer. The first sidewall and the top surface of the first lower semiconductor structure are covered by the first doped region. The method further includes removing the first doped region such that a first oxide portion remains on the second sidewall of the first lower semiconductor structure, and forming a first upper semiconductor structure covering the first sidewall and the top surface of the first lower semiconductor structure after the first doped region is removed.

In an embodiment, the oxide layer extends over a top surface of the semiconductor substrate. In an embodiment, the oxide layer is deposited by an atomic layer deposition (ALD) process. In an embodiment, the ion implantation process is performed such that the first doped region and the first lower semiconductor structure are doped with a dopant. In an embodiment, the first doped region comprises phosphosilicate glass (PSG), borosilicate glass (BSG), or boron-doped phosphosilicate glass (BPSG). In an embodiment, the first doped region is removed by a vapor phase hydrofluoric acid (VHF) etching process.

In an embodiment, the ion implantation process is performed with a tilt angle. In an embodiment, the tilt angle is less than 30 degrees. In an embodiment, the method further includes forming a second lower semiconductor structure over the semiconductor substrate. The second lower semiconductor structure has a third sidewall facing the second sidewall of the first lower semiconductor structure and a fourth sidewall opposite to the third sidewall. In addition, the method includes depositing the oxide layer covering the third sidewall, the fourth sidewall, and a top surface of the second lower semiconductor structure, and performing the ion implantation process to form a second doped region in the oxide layer. The third sidewall and the top surface of the second lower semiconductor structure are covered by the second doped region. In an embodiment, the second doped region is removed such that a second oxide portion remains on the fourth sidewall of the second lower semiconductor structure, and forming a second upper semiconductor structure covering the third sidewall and the top surface of the second lower semiconductor structure after the second doped region is removed. The second upper semiconductor structure is in direct contact with the first oxide portion.

Embodiments of a semiconductor device structure and method for preparing the same are provided in the disclosure. In some embodiments, the semiconductor device structure includes a lower semiconductor structure disposed over a semiconductor substrate. The lower semiconductor structure has a first sidewall and a second sidewall opposite to the first sidewall. In some embodiments, the semiconductor device structure includes an upper semiconductor structure covering a top surface and the first sidewall of the lower semiconductor structure, and an oxide portion extending along the second sidewall of the lower semiconductor structure. The lower semiconductor structure and the upper semiconductor structure include different materials, and the materials of the upper semiconductor structure and the lower semiconductor structure are selected such that the upper semiconductor structure can be selectively deposited on the exposed surfaces (i.e., the top surface and the first sidewall) of the lower semiconductor structure. Therefore, costly lithographic steps can be omitted. As a result, manufacturing cost and processing time can be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
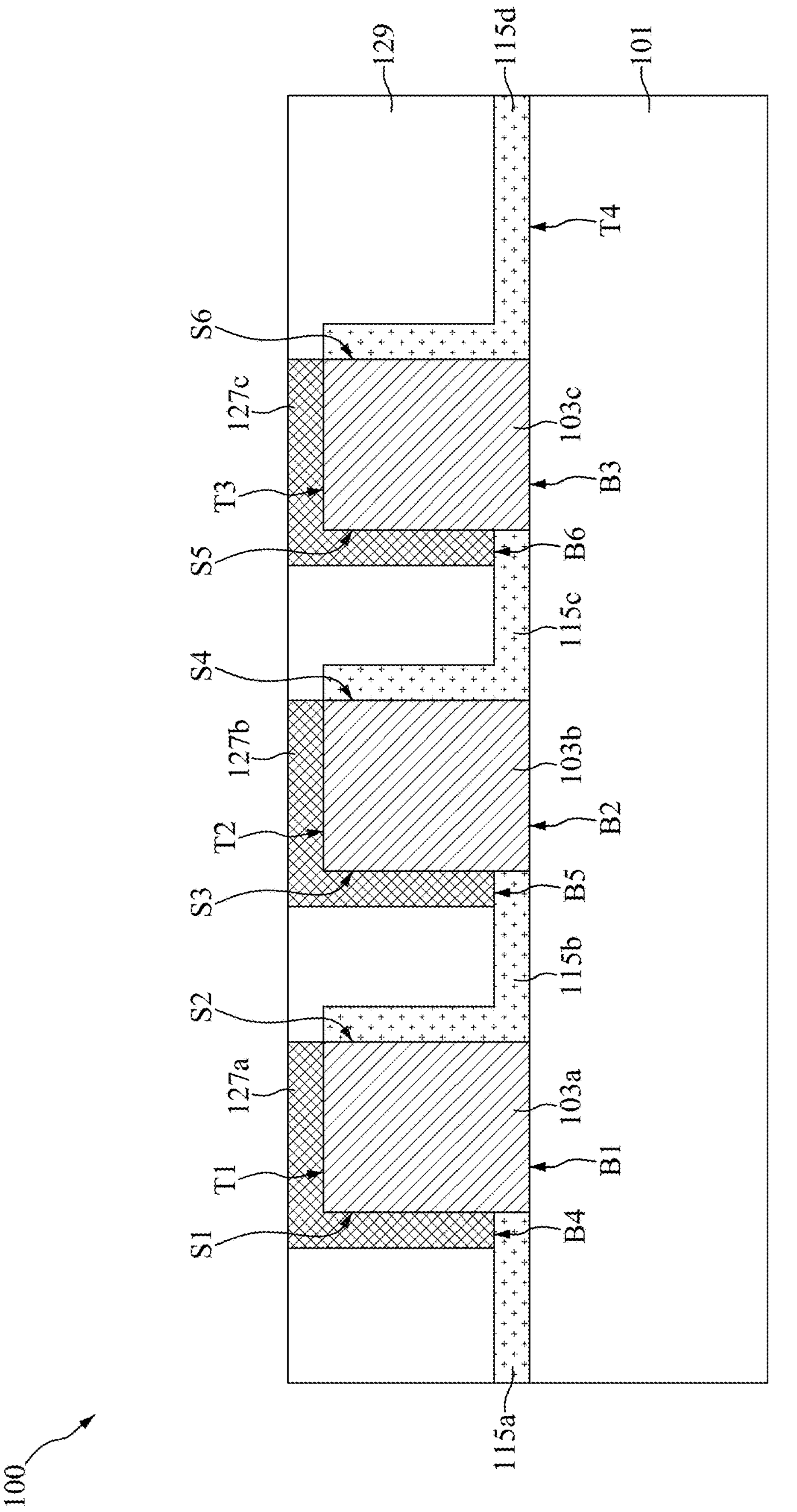
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a plurality of lower semiconductor structures 103*a*, 103*b* and 103*c* and a plurality of oxide portions 115*a*, 115*b*, 115*c* and 115*d* disposed over the semiconductor substrate 101, in accordance with some embodiments. In some embodiments, the semiconductor device structure 100 also includes a plurality of upper semiconductor structures 127*a*, 127*b* and 127*c* respectively disposed over the lower semiconductor structures 103*a*, 103*b* and 103*c*, and a dielectric layer 129 covering the oxide portions 115*a*, 115*b*, 115*c* and 115*d*.

In some embodiments, each of the lower semiconductor structures 103*a*, 103*b* and 103*c* has opposite sidewalls. For example, the lower semiconductor structure 103*a* has opposite sidewalls S1 and S2, the lower semiconductor structure 103*b* has opposite sidewalls S3 and S4, and the lower semiconductor structure 103*c* has opposite sidewalls S5 and S6. In some embodiments, the upper semiconductor structure 127*a* covers and in direct contact with a top surface T1 and the sidewall S1 of the lower semiconductor structure 103*a*, the upper semiconductor structure 127*b* covers and in direct contact with a top surface T2 and the sidewall S3 of the lower semiconductor structure 103*b*, and the upper semiconductor structure 127*c* covers and in direct contact with a top surface T3 and the sidewall S5 of the lower semiconductor structure 103*c*.

In some embodiments, the oxide portion 115*a* covers a top surface T4 of the semiconductor substrate 101, the oxide portion 115*b* covers the top surface T4 of the semiconductor substrate 101 and extends along the sidewall S2 of the lower semiconductor structure 103*a*, the oxide portion 115*c* covers the top surface T4 of the semiconductor substrate 101 and extends along the sidewall S4 of the lower semiconductor structure 103*b*, and the oxide portion 115*d* covers the top surface T4 of the semiconductor substrate 101 and extends along the sidewall S6 of the lower semiconductor structure 103*c*. In some embodiments, the oxide portion 115*b* is in direct contact with the sidewall S2 of the lower semiconductor structure 103*a*, the oxide portion 115*c* is in direct contact with the sidewall S4 of the lower semiconductor structure 103*b*, and the oxide portion 115*d* is in direct contact with the sidewall S6 of the lower semiconductor structure 103*c*.

In some embodiments, each of the oxide portions 115*b*, 115*c* and 115*d* has an L-shape. In some embodiments, although not shown, the oxide portion 115*a* has an L-shape. In some embodiments, the oxide portions 115*a*, 115*b*, 115*c* and 115*d* separate the semiconductor substrate 101 from the dielectric layer 129. In some embodiments, the bottom surfaces of the upper semiconductor structures 127*a*, 127*b* and 127*c* are higher than the bottom surfaces of the lower semiconductor structures 103*a*, 103*b* and 103*c*. For example, the bottom surface B4 of the upper semiconductor structure 127*a* is higher than the bottom surface B1 of the lower semiconductor structure 103*a*, the bottom surface B5 of the upper semiconductor structure 127*b* is higher than the bottom surface B2 of the lower semiconductor structure 103*b*, and the bottom surface B6 of the upper semiconductor structure 127*c* is higher than the bottom surface B3 of the lower semiconductor structure 103*c*.

Moreover, in some embodiments, the upper semiconductor structure 127*a* is disposed over the oxide portion 115*a*, the upper semiconductor structure 127*b* is disposed over the oxide portion 115*b*, and the upper semiconductor structure 127*c* is disposed over the oxide portion 115*c*. In some embodiments, the bottom surface B4 of the upper semiconductor structure 127*a* is in direct contact with the oxide portion 115*a*, the bottom surface B5 of the upper semiconductor structure 127*b* is in direct contact with the oxide portion 115*b*, and the bottom surface B6 of the upper semiconductor structure 127*c* is in direct contact with the oxide portion 115*c*.

In addition, the upper semiconductor structures 127*a*, 127*b* and 127*c* are surrounded by the dielectric layer 129, in accordance with some embodiments. In some embodiments, the lower semiconductor structures 103*a*, 103*b* and 103*c* include a first material, the upper semiconductor structures 127*a*, 127*b* and 127*c* include a second material, and the first material is different from the second material. For example, the lower semiconductor structures 103*a*, 103*b* and 103*c* include doped polysilicon, and the upper semiconductor structures 127*a*, 127*b* and 127*c* include germanium (Ge). In some embodiments, the oxide portions 115*a*, 115*b*, 115*c* and 115*d* include the same material, such as tetraethylorthosilicate (TEOS) oxide. However, any other suitable oxide materials may be utilized.

In some embodiments, the lower semiconductor structure 103*a* is separated from the dielectric layer 129 by the upper semiconductor structure 127*a* and the oxide portions 115*a* and 115*b*. In some embodiments, the lower semiconductor structure 103*b* is separated from the dielectric layer 129 by the upper semiconductor structure 127*b* and the oxide portions 115*b* and 115*c*. In some embodiments, the lower semiconductor structure 103*c* is separated from the dielectric layer 129 by the upper semiconductor structure 127*c* and the oxide portions 115*c* and 115*d*. In some embodiments, the lower semiconductor structure 103*a* and the upper semiconductor structure 127*a* collectively form a composite interconnect structure, the lower semiconductor structure 103*b* and the upper semiconductor structure 127*b* collectively form a composite interconnect structure, and the lower semiconductor structure 103*c* and the upper semiconductor structure 127*c* collectively form a composite interconnect structure.

In some embodiments, the semiconductor device structure 100 includes composite interconnect structures having lower semiconductor structures 103*a*, 103*b*, 103*c* and upper semiconductor structures 127*a*, 127*b*, 127*c*. In some embodiments, the lower semiconductor structures 103*a*, 103*b*, 103*c* and the upper semiconductor structures 127*a*, 127*b*, 127*c* include different materials, and the materials are selected such that the upper semiconductor structures 127*a*, 127*b*, 127*c* can be selectively deposited on the top surfaces T1, T2, T3 and the sidewalls S1, S3, S5 of the lower semiconductor structures 103*a*, 103*b*, 103*c*, which are the exposed surfaces of the lower semiconductor structures 103*a*, 103*b*, 103*c* after the oxide portions 115*a*, 115*b*, 115*c* and 115*d* are formed. Therefore, costly lithographic steps can be omitted. As a result, manufacturing cost and processing time can be reduced.

Figure 2:
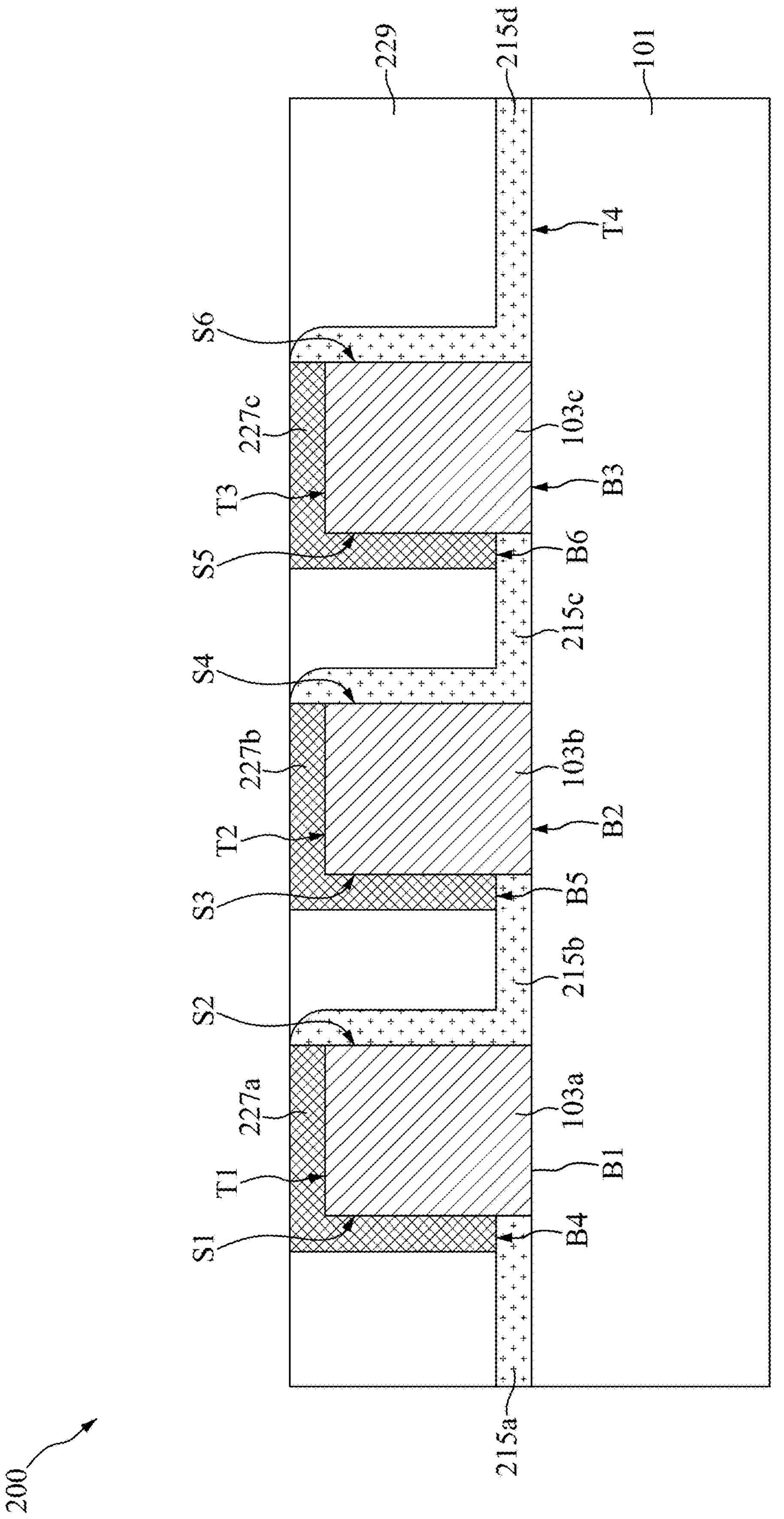
FIG. 2 is a cross-sectional view illustrating a semiconductor device structure, in accordance with some other embodiments.

FIG. 2 is a cross-sectional view illustrating a semiconductor device structure 200, in accordance with some other embodiments. The semiconductor device structure 200 is similar to the semiconductor device structure 100. However, in the semiconductor device structure 200, a plurality of oxide portions 215*a*, 215*b*, 215*c* and 215*d* are disposed over the top surface T4 of the semiconductor substrate 101, and the oxide portions 215*b*, 215*c* and 215*d* further extend upwardly to respectively contact the upper semiconductor structures 227*a*, 227*b* and 227*c*, in accordance with some embodiments. In addition, a dielectric layer 225 is formed covering the oxide portions 215*a*, 215*b*, 215*c* and 215*d*, and the upper semiconductor structures 227*a*, 227*b* and 227*c* are surrounded by the dielectric layer 229, in accordance with some embodiments.

Figure 3:
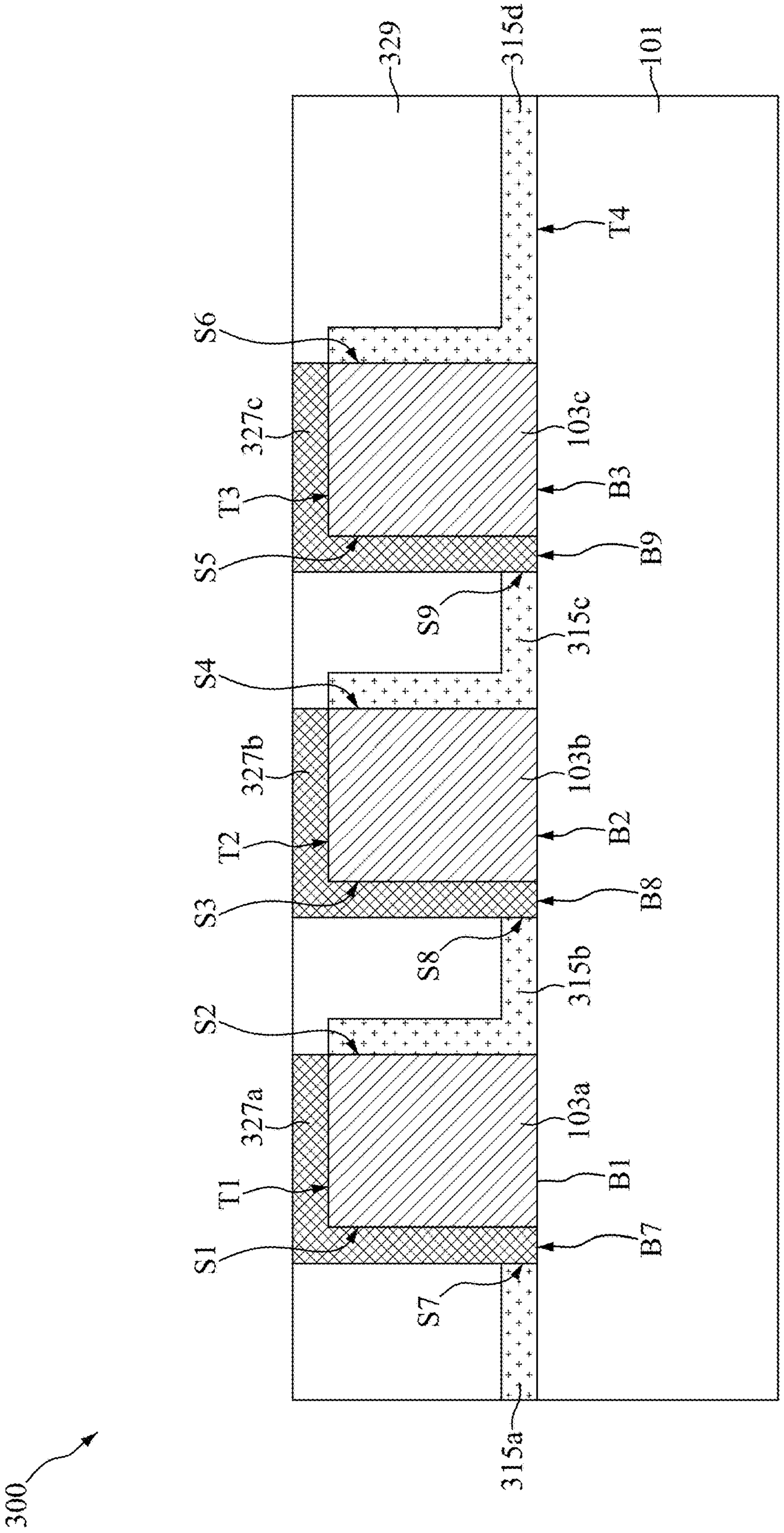
FIG. 3 is a cross-sectional view illustrating a semiconductor device structure, in accordance with some other embodiments.

FIG. 3 is a cross-sectional view illustrating a semiconductor device structure 300, in accordance with some other embodiments. The semiconductor device structure 300 is similar to the semiconductor device structure 100. However, in the semiconductor device structure 300, a plurality of upper semiconductor structures 327*a*, 327*b* and 327*c* further extends downwardly to directly contact the top surface T4 of the semiconductor substrate, in accordance with some embodiments. In other words, portions of the upper semiconductor structures 327*a*, 327*b* and 327*c* are sandwiched between the lower semiconductor structures 103*a*, 103*b*, 103*c* and the oxide portions 315*a*, 315*b*, 315*c* and 315*d*.

In some embodiments, a sidewall S7 of the upper semiconductor structures 327*a* is in direct contact with the oxide portion 315*a*, a sidewall S8 of the upper semiconductor structures 327*b* is in direct contact with the oxide portion 315*b*, a sidewall S9 of the upper semiconductor structures 327*c* is in direct contact with the oxide portion 315*c*. In some embodiments, the bottom surfaces B7, B8 and B9 of the upper semiconductor structures 327*a*, 327*b* and 327*c* are substantially level with the bottom surfaces B1, B2 and B3 of the lower semiconductor structures 103*a*, 103*b* and 103*c*.

Within the context of this disclosure, the word "substantially" means preferably at least 90%, more preferably 95%, even more preferably 98%, and most preferably 99%. In some embodiments, the semiconductor device structure 300 includes a dielectric layer 329 covering the oxide portions 315*a*, 315*b*, 315*c* sand 315*d*, and the upper semiconductor structures 327*a*, 327*b* and 327*c* are surrounded by the dielectric layer 329.

Figure 4:
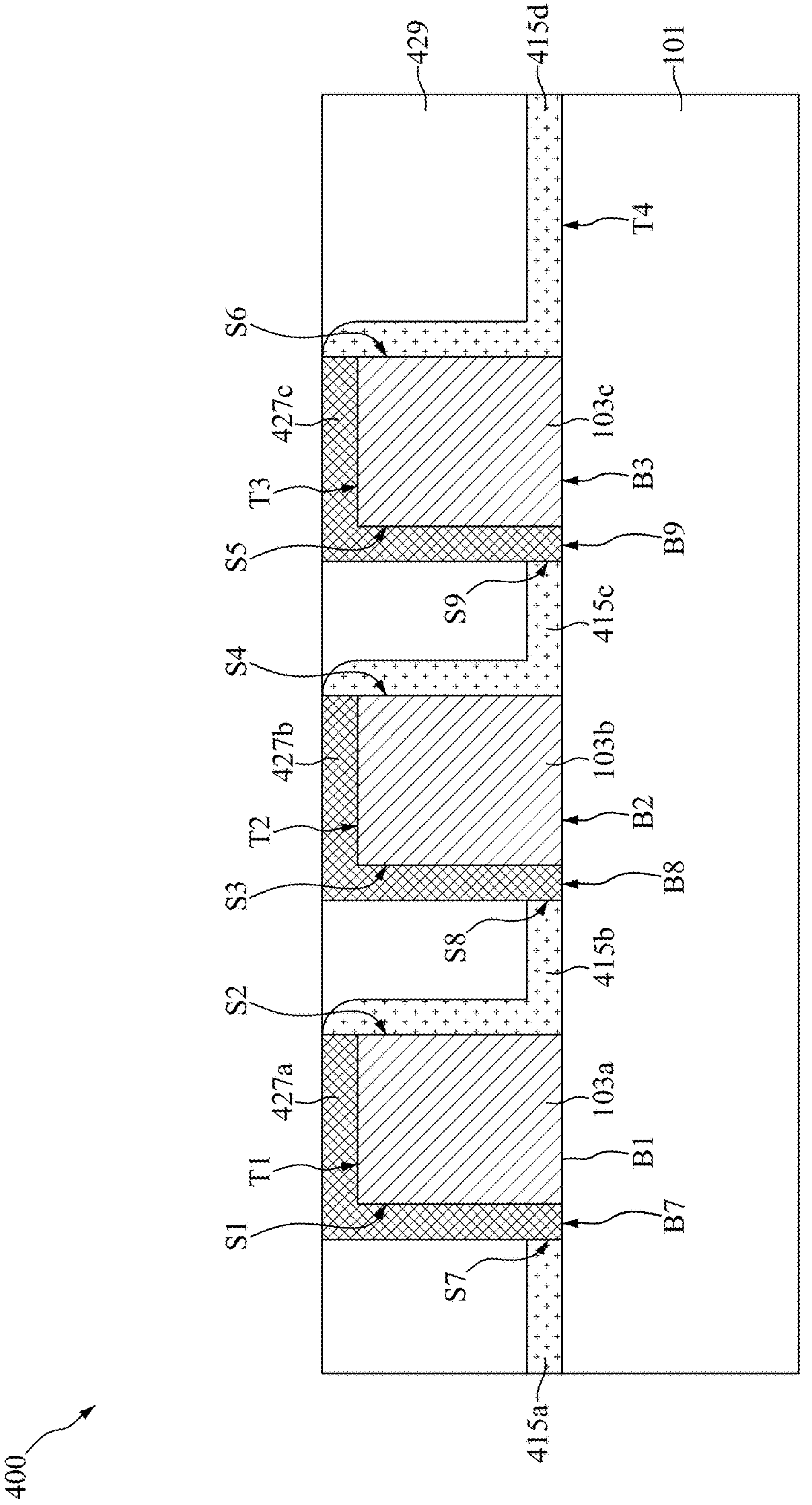
FIG. 4 is a cross-sectional view illustrating a semiconductor device structure, in accordance with some other embodiments.

FIG. 4 is a cross-sectional view illustrating a semiconductor device structure 400, in accordance with some other embodiments. The semiconductor device structure 400 is similar to the semiconductor device structure 300. However, in the semiconductor device structure 400, a plurality of oxide portions 415*a*, 415*b*, 415*c* and 415*d* are disposed over the top surface T4 of the semiconductor substrate 101, and the oxide portions 415*b*, 415*c* and 415*d* further extend upwardly to respectively contact the upper semiconductor structures 427*a*, 427*b* and 427*c*, in accordance with some embodiments. In addition, a dielectric layer 429 is formed covering the oxide portions 415*a*, 415*b*, 415*c* and 415*d*, and the upper semiconductor structures 427*a*, 427*b* and 427*c* are surrounded by the dielectric layer 429, in accordance with some embodiments.

Figure 5:
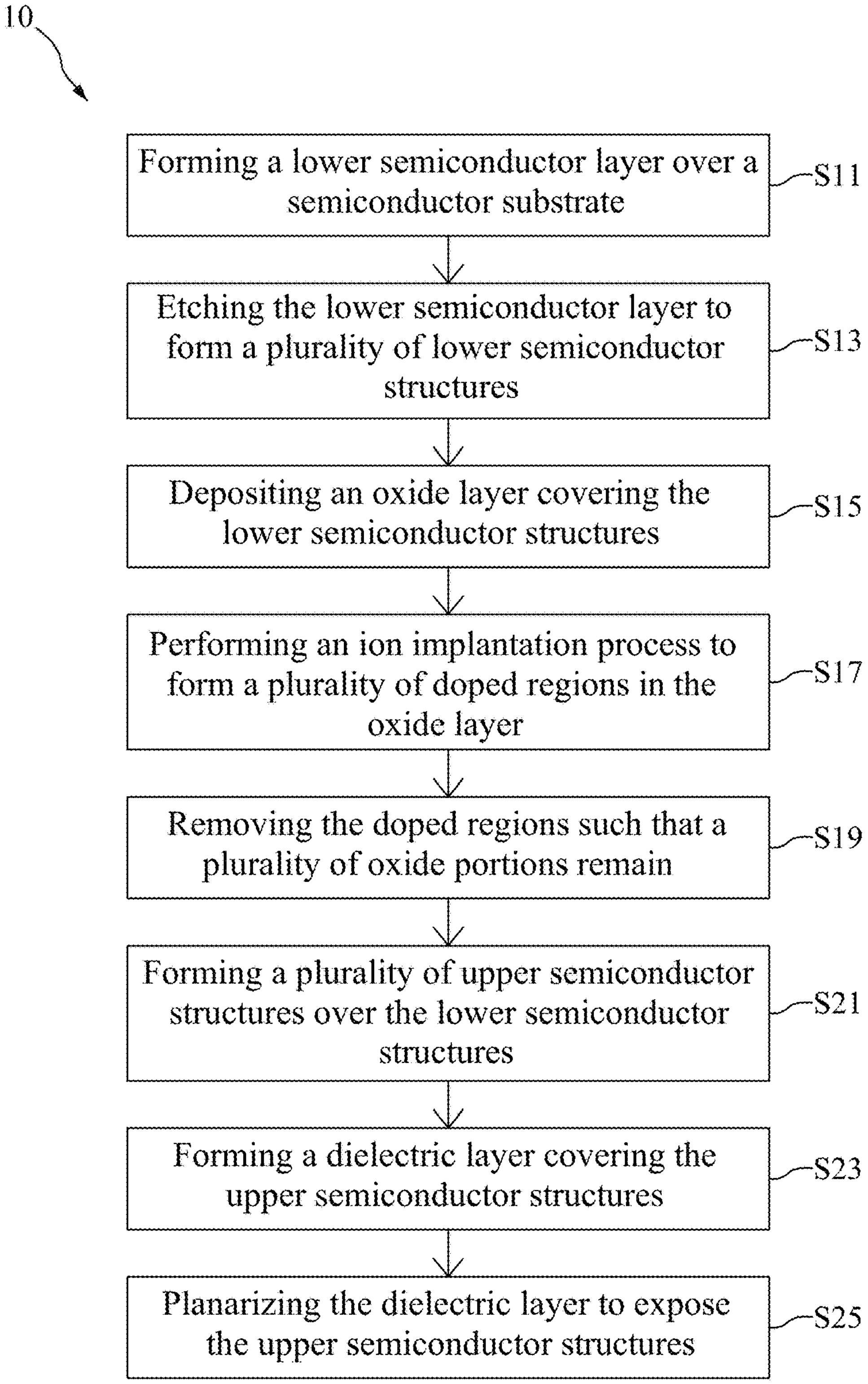
FIG. 5 is a flow diagram illustrating a method for preparing a semiconductor device structure, in accordance with some embodiments.

FIG. 5 is a flow diagram illustrating a method 10 for preparing a semiconductor device structure (e.g., the semiconductor device structures 100, 200, 300 and 400), and the method 10 includes steps S11, S13, S15, S17, S19, S21, S23, and S25, in accordance with some embodiments. The steps S11 to S25 of FIG. 5 are elaborated in connection with the following figures.

Figure 6:
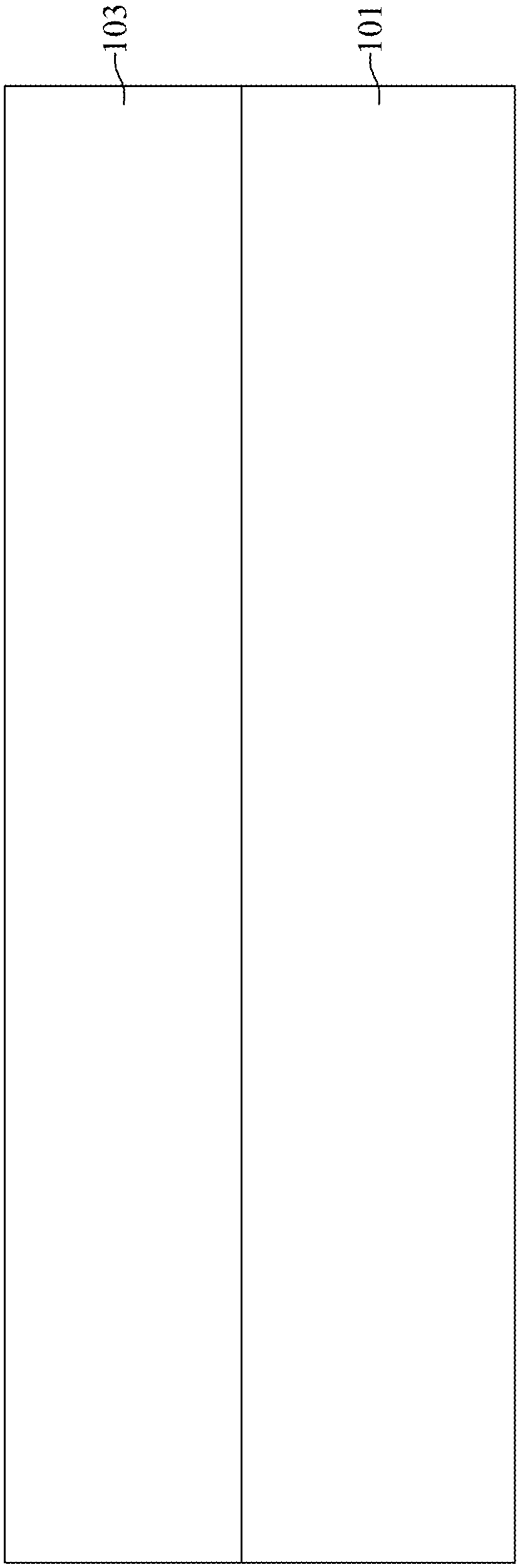
FIG. 6 is a cross-sectional view illustrating an intermediate stage of forming a lower semiconductor layer over a semiconductor substrate during the formation of the semiconductor device structure, in accordance with some embodiments.

FIGS. 6-13 are cross-sectional views illustrating intermediate stages of forming the semiconductor device structure 100, in accordance with some embodiments. As shown in FIG. 6, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A lower semiconductor layer 103 is formed over the semiconductor substrate 101, as shown in FIG. 6 in accordance with some embodiments. The respective step is illustrated as the step S11 in the method 10 shown in FIG. 5. In some embodiments, the lower semiconductor layer 103 includes polysilicon. The lower semiconductor layer 103 may be formed by a deposition process, such as a chemical vapor deposition (CVD) process, a physical vapor deposition (PVD) process, an atomic layer deposition (ALD) process, a spin-on coating process, or another suitable method.

Figure 7:
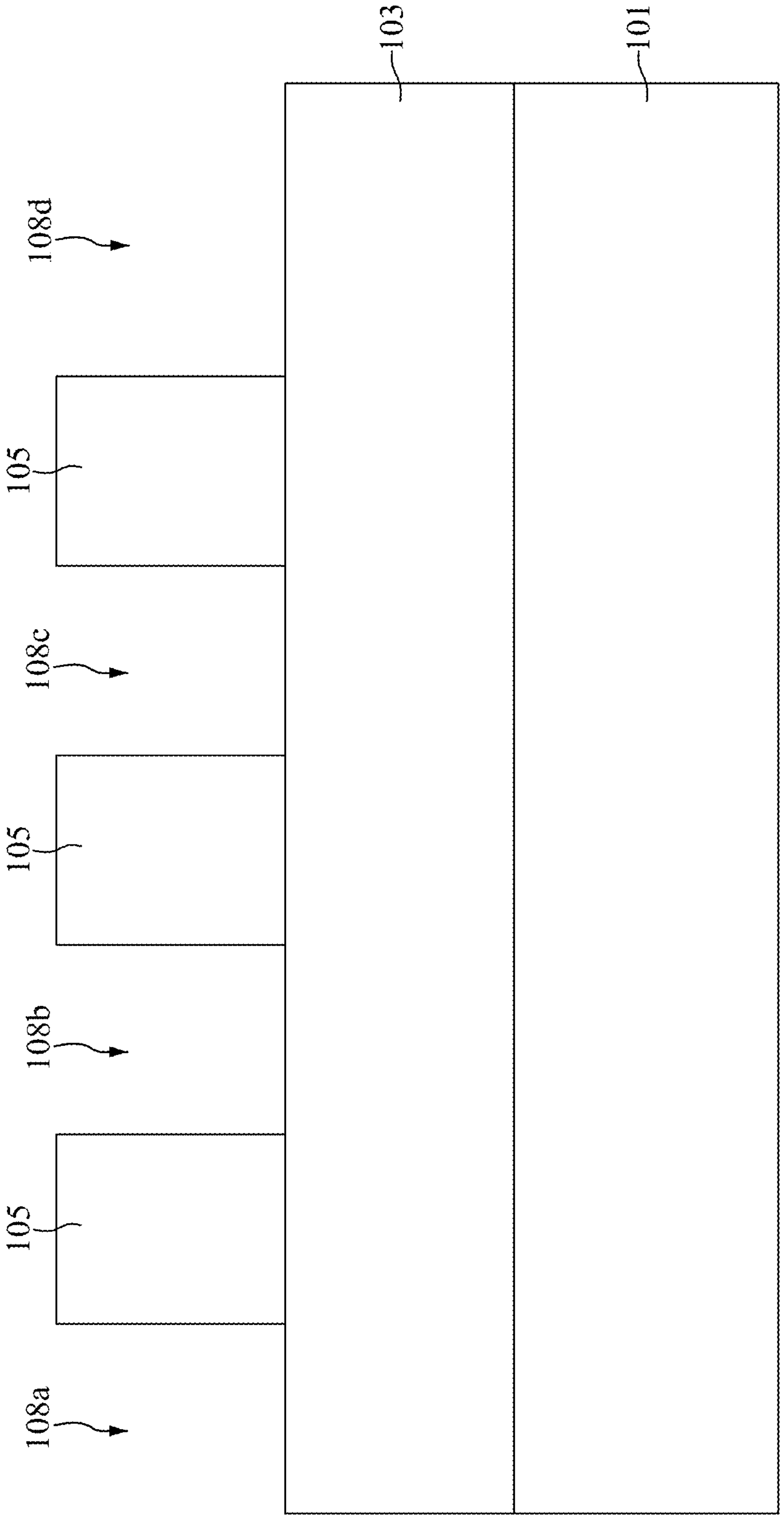
FIG. 7 is a cross-sectional view illustrating an intermediate stage of forming a patterned mask over the lower semiconductor layer during the formation of the semiconductor device structure, in accordance with some embodiments.

Then, a patterned mask 105 with openings 108*a*, 108*b*, 108*c* and 108*d* is formed over the lower semiconductor layer 103, as shown in FIG. 7 in accordance with some embodiments. In some embodiments, the lower semiconductor layer 103 is partially exposed by the openings 108*a*, 108*b*, 108*c* and 108*d*. In some embodiments, the patterned mask 105 and the lower semiconductor layer 103 include different materials so that the etching selectivities may be different in the subsequent etching process.

Figure 8:
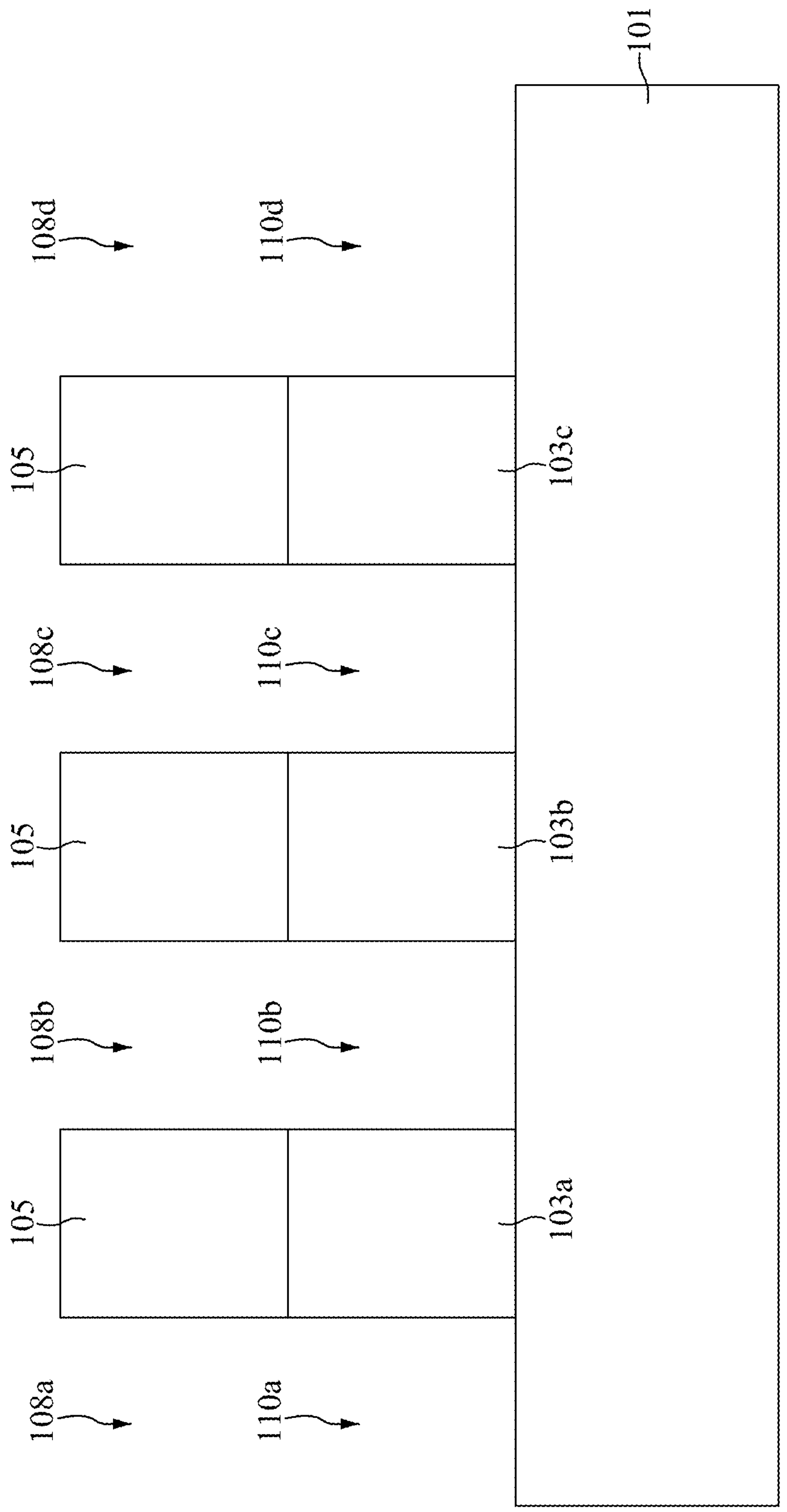
FIG. 8 is a cross-sectional view illustrating an intermediate stage of forming a plurality of lower semiconductor structures during the formation of the semiconductor device structure, in accordance with some embodiments.

Next, the lower semiconductor layer 103 is etched to form a plurality of lower semiconductor structures 103*a*, 103*b* and 103*c* using the patterned mask 105 as an etching mask, as shown in FIG. 8 in accordance with some embodiments. The respective step is illustrated as the step S13 in the method 10 shown in FIG. 5. In some embodiments, a plurality of openings 110*a*, 110*b*, 110*c* and 110*d* are formed penetrating through the lower semiconductor layer 103 (see FIG. 7), and the semiconductor substrate 101 is exposed by the openings 110*a*, 110*b*, 110*c* and 110*d*. After the openings 110*a*, 110*b*, 110*c* and 110*d* are formed, the patterned mask 105 can be removed.

Figure 9:
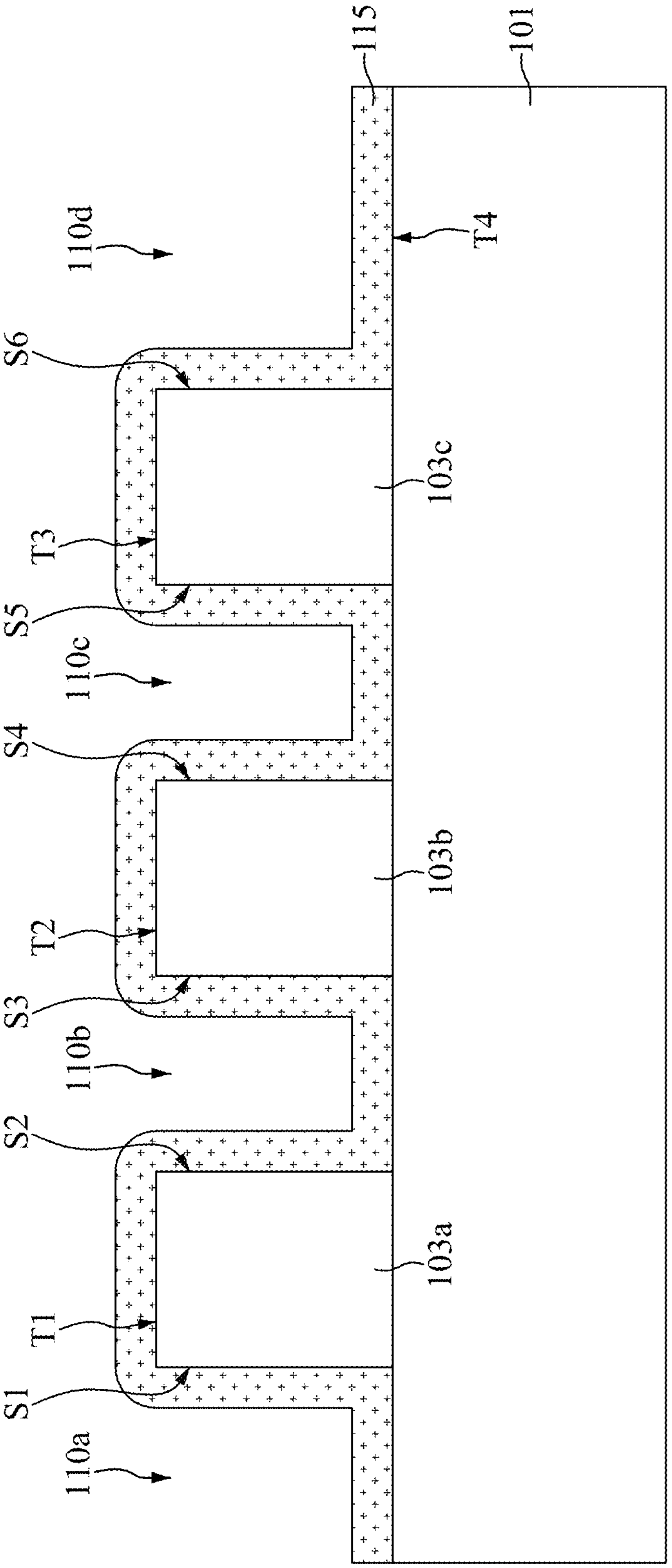
FIG. 9 is a cross-sectional view illustrating an intermediate stage of depositing an oxide layer covering the lower semiconductor structures during the formation of the semiconductor device structure, in accordance with some embodiments.

Subsequently, an oxide layer 115 is formed conformally covering the structure after the patterned mask 105 is removed, as shown in FIG. 9 in accordance with some embodiments. In some embodiments, the top surfaces T1, T2, T3 and the sidewalls S1, S2, S3, S4, S5, S6 of the lower semiconductor structures 103*a*, 103*b* and 103*c*, and the top surface T4 of the semiconductor substrate 101 are covered by the oxide layer 115. The respective step is illustrated as the step S15 in the method 10 shown in FIG. 5. In some embodiments, the oxide layer 115 includes TEOS oxide. In addition, the oxide layer 115 is formed by an ALD process, in accordance with some embodiments.

Figure 10:
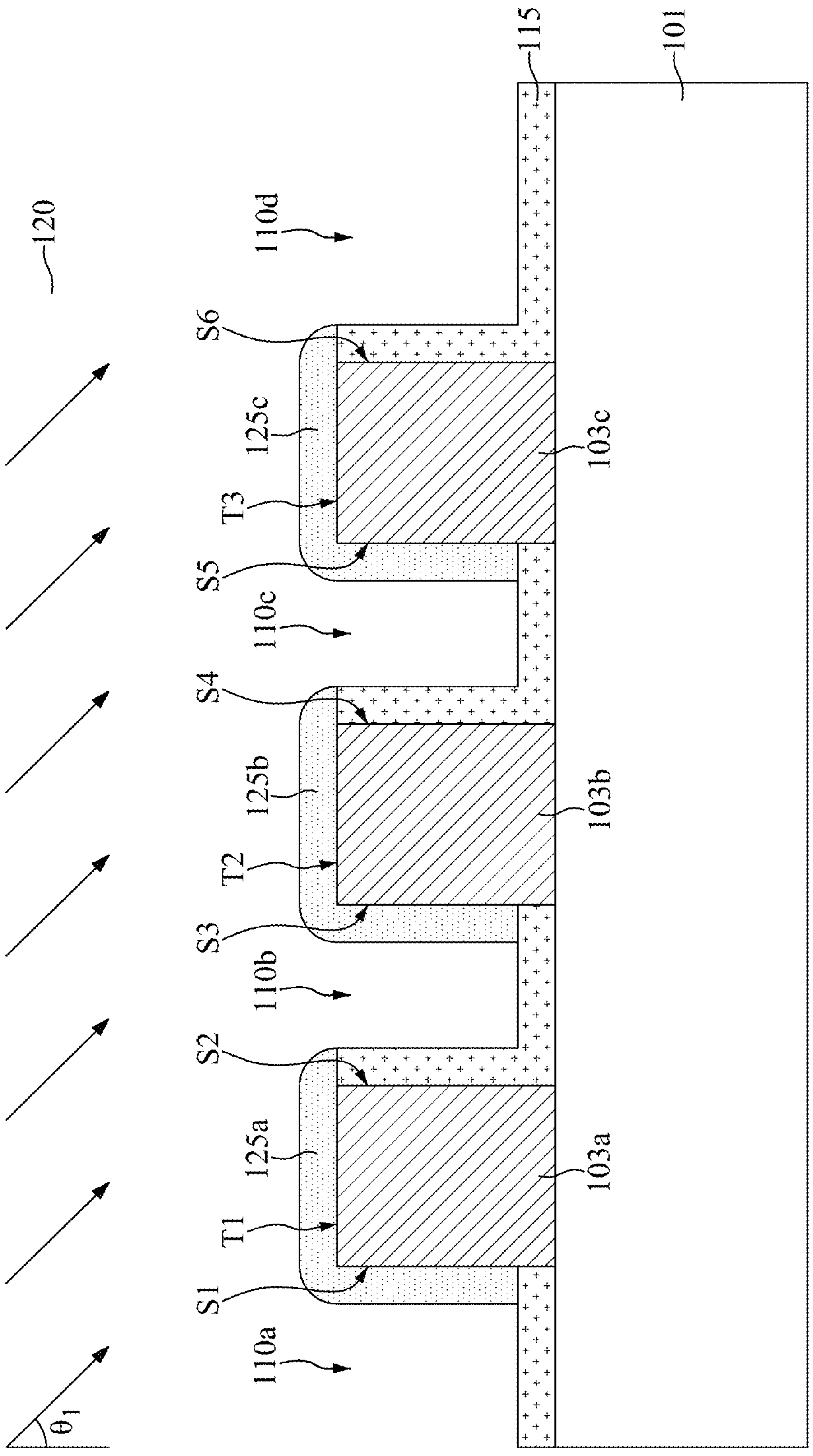
FIG. 10 is a cross-sectional view illustrating an intermediate stage of performing an ion implantation process to form a plurality of doped regions in the oxide layer during the formation of the semiconductor device structure, in accordance with some embodiments.

Then, an ion implantation process 120 is performed to form a plurality of doped regions 125*a*, 125*b*, and 125*c* in the oxide layer 115, as shown in FIG. 10 in accordance with some embodiments. The respective step is illustrated as the step S17 in the method 10 shown in FIG. 5. In some embodiments, the ion implantation process 120 is performed with a tilt angle $\theta_1$. In some embodiments, the tilt angle $\theta_1$ is less than 30 degrees, such that the doped region 125*a* is formed covering the top surface T1 and the sidewall S1 of the lower semiconductor structure 103*a*, the doped region 125*b* is formed covering the top surface T2 and the sidewall S3 of the lower semiconductor structure 103*b*, and the doped region 125*c* is formed covering the top surface T3 and the sidewall S5 of the lower semiconductor structure 103*c*.

Moreover, the lower semiconductor structures 103*a*, 103*b* and 103*c* are doped during the ion implantation process 120. In some embodiments, depending on the conductivity type of the to-be-formed semiconductor device structure 100, a P-type dopant, such as boron (B), and/or an N-type dopant, such as phosphorous (P), can be implanted to form the doped regions 125*a*, 125*b* and 125*c*. In some embodiments, a thermal treating process is performed after the ion implantation process 120, such that the doped regions 125*a*, 125*b* and 125*c* include phosphosilicate glass (PSG), borosilicate glass (BSG), or boron-doped phosphosilicate glass (BPSG).

After the ion implantation process 120 is performed, the doped regions 125*a*, 125*b*, 125*c* have the same conductivity type as the lower semiconductor structures 103*a*, 103*b*, and 103*c*. In some embodiments, the portions of the oxide layer 115 covering and in direct contact with the sidewalls S2, S4 and S6 of the lower semiconductor structures 103*a*, 103*b* and 103*c* remain undoped.

Figure 11:
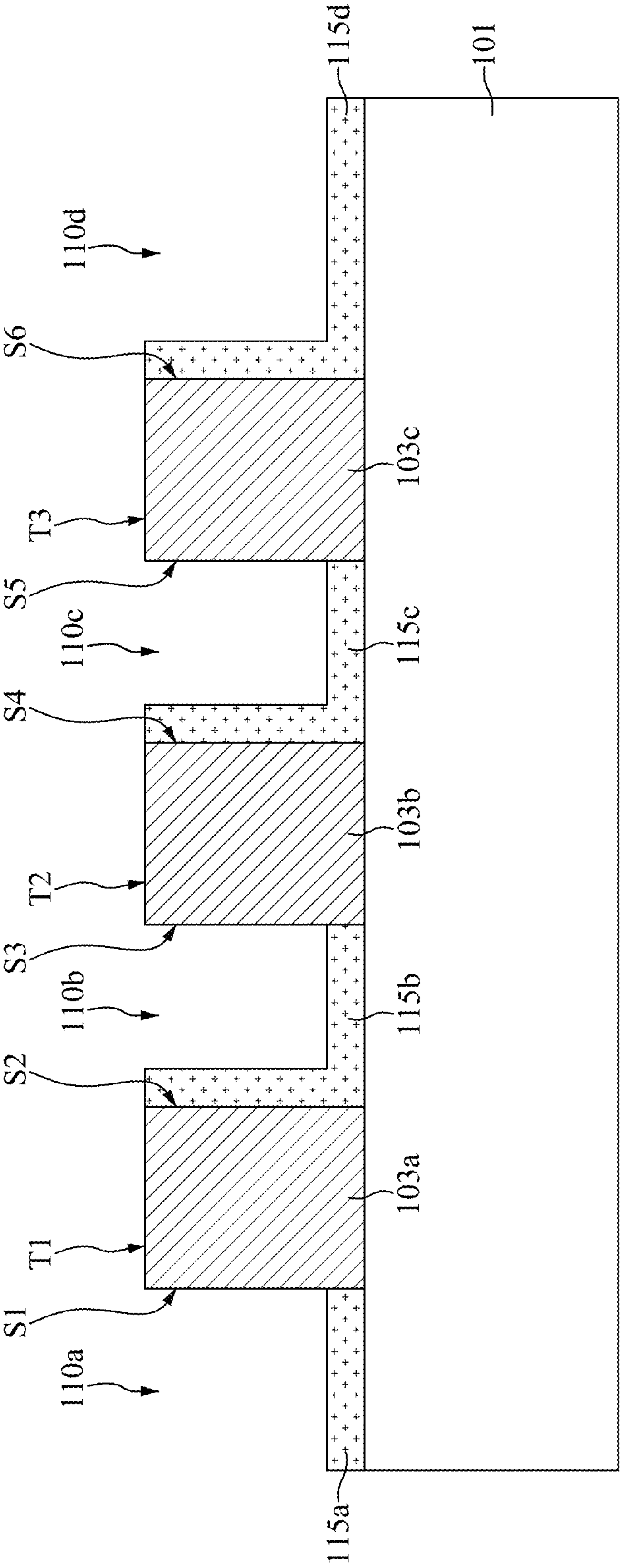
FIG. 11 is a cross-sectional view illustrating an intermediate stage of removing the doped regions such that a plurality of oxide portions remain during the formation of the semiconductor device structure, in accordance with some embodiments.

Next, the doped regions 125*a*, 125*b*, 125*c* are removed by a vapor phase hydrofluoric acid (VHF) etching process such that undoped regions of the oxide layer 115 (i.e., the oxide portions 115*a*, 115*b*, 115*c*, 115*d*) remain, as shown in FIG. 11 in accordance with some embodiments. The respective step is illustrated as the step S19 in the method 10 shown in FIG. 5. During the etching process, VHF is used as an etchant, and the doped regions 125*a*, 125*b*, 125*c* have a high selectivity against the lower semiconductor structures 103*a*, 103*b*, 103*c* and the remaining undoped regions of the oxide layer 115. Therefore, the doped regions 125*a*, 125*b*, 125*c* are removed by the etching process, while the oxide portions 115*a*, 115*b*, 115*c* and 115*d* may be substantially left. In some embodiments, the top surface T1 and the sidewall S1 of the lower semiconductor structure 103*a*, the top surface T2 and the sidewall S3 of the lower semiconductor structure 103*b*, and the top surface T3 and the sidewall S5 of the lower semiconductor structure 103*c* are exposed after the etching process.

Figure 12:
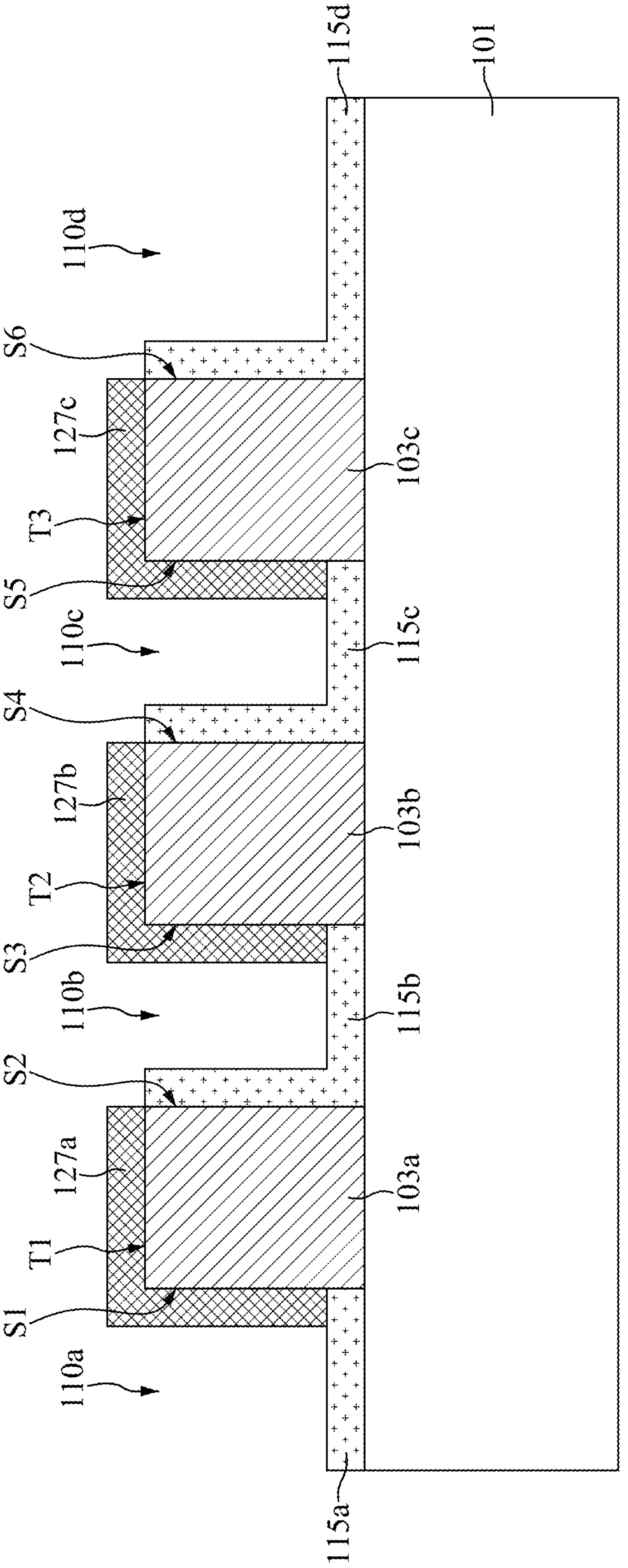
FIG. 12 is a cross-sectional view illustrating an intermediate stage of forming a plurality of upper semiconductor structures over the lower semiconductor structures during the formation of the semiconductor device structure, in accordance with some embodiments.

Subsequently, a plurality of upper semiconductor structures 127*a*, 127*b* and 127*c* are selectively deposited over the lower semiconductor structures 103*a*, 103*b* and 103*c*, as shown in FIG. 12 in accordance with some embodiments. The respective step is illustrated as the step S21 in the method 10 shown in FIG. 5. In some embodiments, the upper semiconductor structures 127*a*, 127*b* and 127*c* covers the exposed surfaces of the lower semiconductor structures 103*a*, 103*b* and 103*c* after the doped regions 125*a*, 125*b* and 125*c* are removed by the etching process.

In some embodiments, the top surface T1 and the sidewall S1 of the lower semiconductor structure 103*a* are covered by the upper semiconductor structure 127*a*, the top surface T2 and the sidewall S2 of the lower semiconductor structure 103*b* are covered by the upper semiconductor structure 127*b*, and the top surface T3 and the sidewall S3 of the lower semiconductor structure 103*c* are covered by the upper semiconductor structure 127*c*. In some embodiments, the upper semiconductor structures 127*a*, 127*b* and 127*c* comprise germanium (Ge). In some embodiments, the upper semiconductor structures 127*a*, 127*b* and 127*c* are formed by a deposition process, such as a CVD process, a PVD process, an ALD process, or another suitable deposition process.

Figure 13:
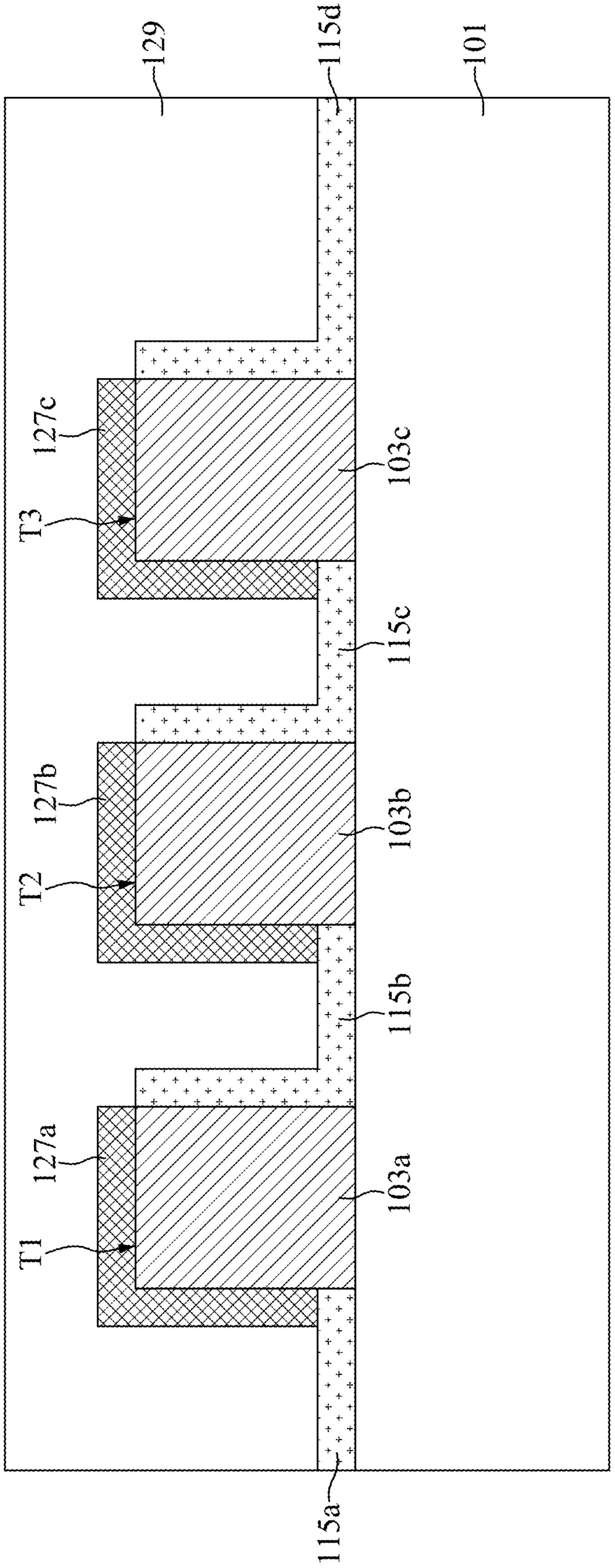
FIG. 13 is a cross-sectional view illustrating an intermediate stage of forming a dielectric layer covering the upper semiconductor structures and the oxide portions during the formation of the semiconductor device structure, in accordance with some embodiments.

Then, a dielectric layer 129 is formed covering the structure, as shown in FIG. 13 in accordance with some embodiments. The respective step is illustrated as the step S23 in the method 10 shown in FIG. 5. In some embodiments, the dielectric layer 129 includes a dielectric material, such as silicon oxide, silicon nitride, silicon oxynitride, or another suitable dielectric material. Moreover, the dielectric layer 129 is formed by a deposition process, such as a CVD process, a PVD process, an ALD process, a spin-on coating process, or another suitable method.

After the dielectric layer 129 is deposited, a planarization process is performed on the dielectric layer 129 to remove excess portions of the dielectric layer 129 over the upper semiconductor structures 127*a*, 127*b* and 127*c*, as shown in FIG. 1 in accordance with some embodiments. In some embodiments, the planarization process is performed until the upper semiconductor structures 127*a*, 127*b* and 127*c* are exposed. The respective step is illustrated as the step S25 in the method 10 shown in FIG. 5. The planarization process may include a chemical mechanical polishing (CMP) process. After the planarization process, the semiconductor device structure 100 is obtained.

Figure 14:
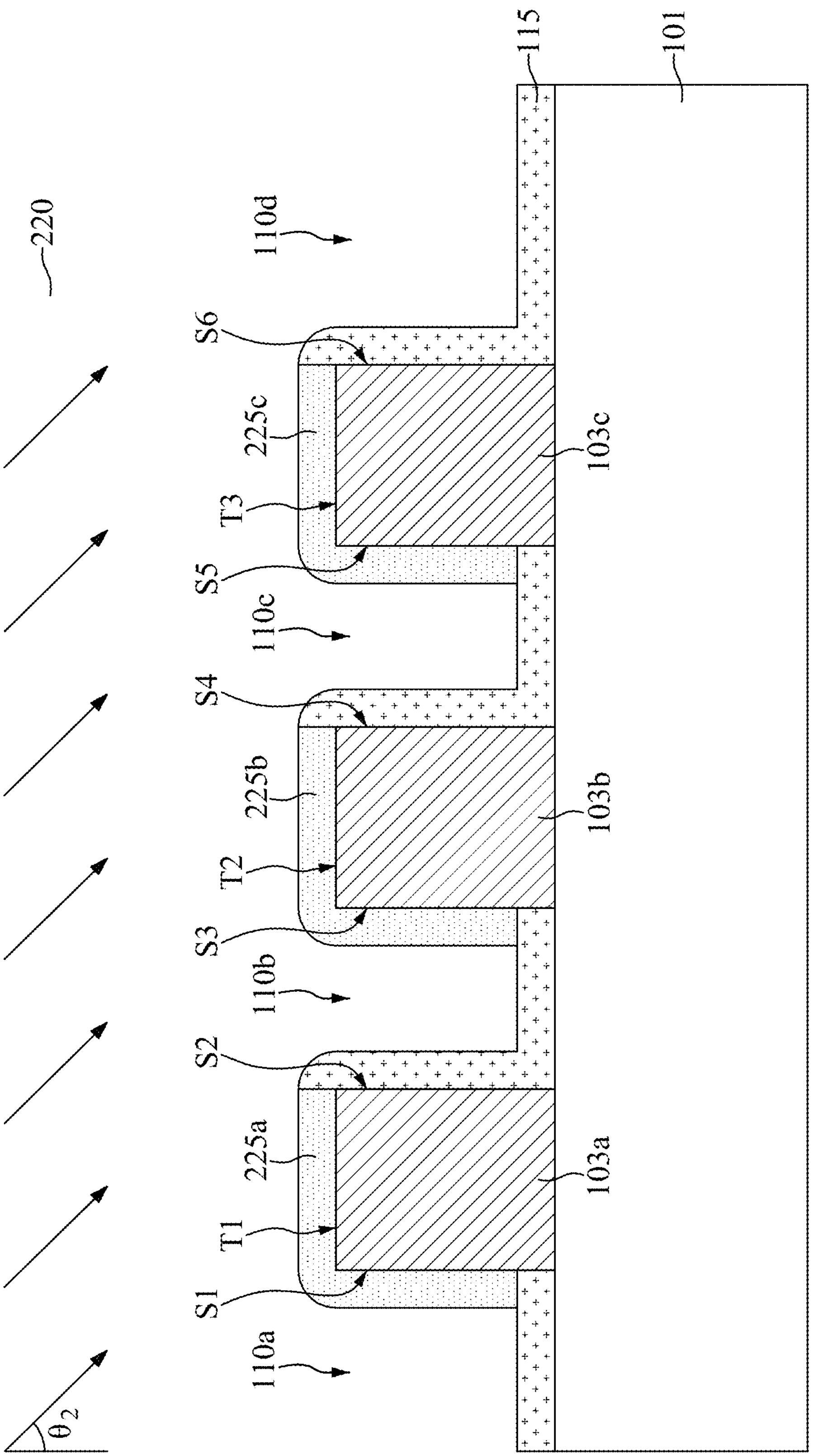
FIG. 14 is a cross-sectional view illustrating an intermediate stage of performing an ion implantation process to form a plurality of doped regions in the oxide layer during the formation of the semiconductor device structure, in accordance with some other embodiments.
Figure 15:
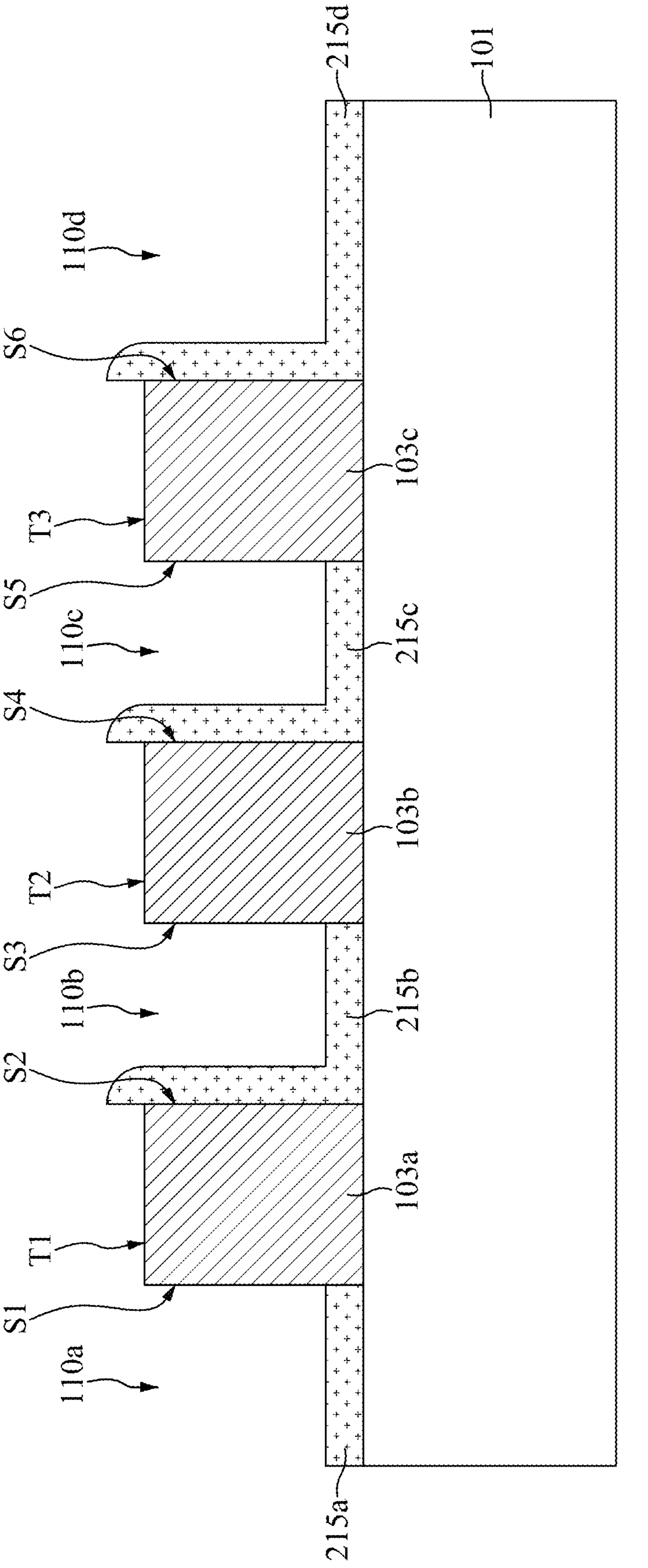
FIG. 15 is a cross-sectional view illustrating an intermediate stage of removing the doped regions such that a plurality of oxide portions remain during the formation of the semiconductor device structure, in accordance with some other embodiments.
Figure 16:
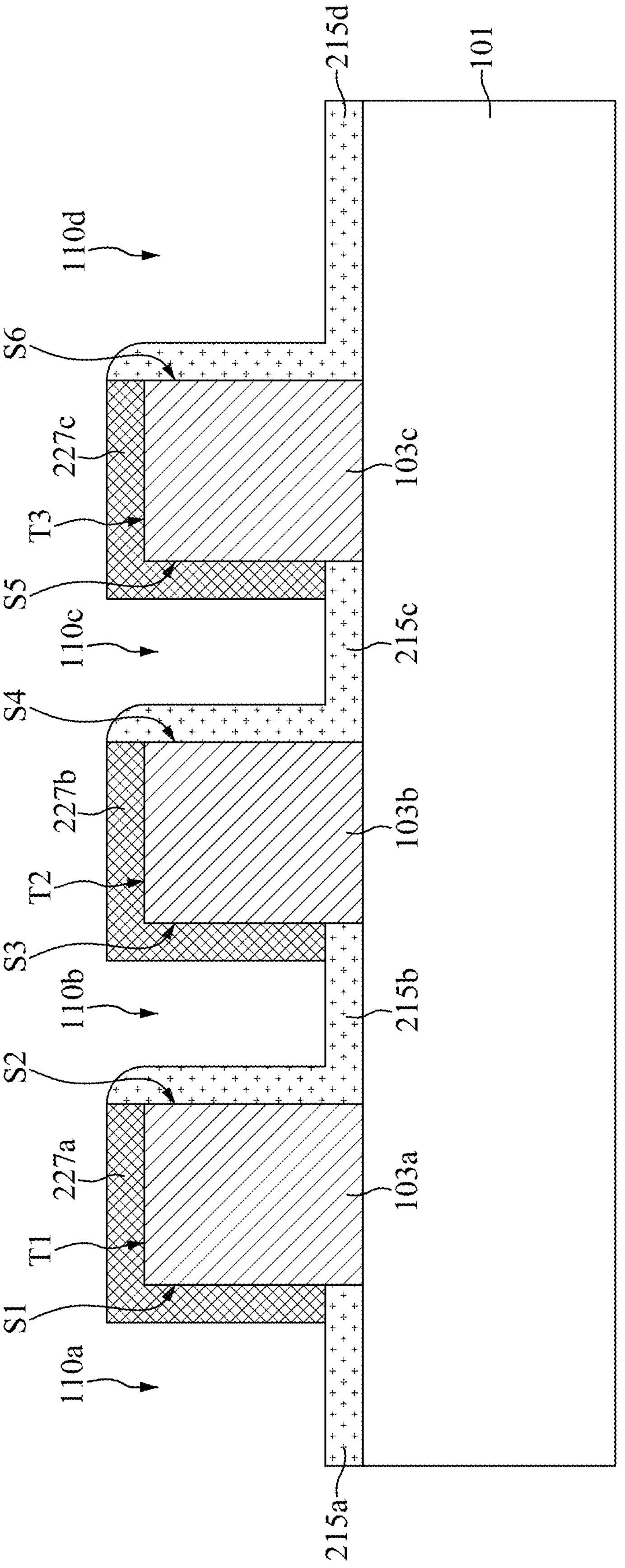
FIG. 16 is a cross-sectional view illustrating an intermediate stage of forming a plurality of upper semiconductor structures over the lower semiconductor structures during the formation of the semiconductor device structure, in accordance with some other embodiments.

FIGS. 14-16 are cross-sectional views illustrating intermediate stages of forming the semiconductor device structure 200, in accordance with some embodiments. It should be pointed out that operations for forming the semiconductor device 200 before the structure shown in FIG. 14 are substantially the same as the operations for forming the semiconductor device 100 shown in FIGS. 6-9, and the related detailed descriptions may refer to the foregoing paragraphs and are not discussed again herein.

After the oxide layer 115 is formed, an ion implantation process 220 is performed to form a plurality of doped regions 225*a*, 225*b*, and 225*c* in the oxide layer 115, as shown in FIG. 14 in accordance with some embodiments. In some embodiments, the ion implantation process 220 is performed with a tilt angle $\theta_2$. In some embodiments, the tilt angle $\theta_2$ is less than 30 degrees. In some embodiments, the tile angle $\theta_2$ is different from the tilt angle $\theta_1$ utilized in the ion implantation process 120 for forming the semiconductor device structure 100. In some embodiments, the dose of the ion implantation process 220 is different from the dose of the ion implantation process 120.

Similar to the ion implantation process 120, a P-type dopant, such as boron (B), and/or an N-type dopant, such as phosphorous (P), can be implanted to form the doped regions 225*a*, 225*b* and 225*c*, and a thermal treating process is performed after the ion implantation process 220, such that the doped regions 225*a*, 225*b* and 225*c* include PSG, BSG, or BPSG. In some embodiments, after the ion implantation process 220 is performed, the doped regions 225*a*, 225*b*, 225*c* have the same conductivity type as the lower semiconductor structures 103*a*, 103*b*, and 103*c*. In some embodiments, the portions of the oxide layer 115 covering and in direct contact with the sidewalls S2, S4 and S6 of the lower semiconductor structures 103*a*, 103*b* and 103*c* remain undoped.

Next, the doped regions 225*a*, 225*b*, 225*c* are removed by a VHF etching process such that undoped regions of the oxide layer 115 (i.e., the oxide portions 215*a*, 215*b*, 215*c*, 215*d*) remain, as shown in FIG. 15 in accordance with some embodiments. The etching process for removing the doped regions have been described in detail in the aforementioned embodiment, so that details thereof are not repeated.

In some embodiments, the top surface T1 and the sidewall S1 of the lower semiconductor structure 103*a*, the top surface T2 and the sidewall S3 of the lower semiconductor structure 103*b*, and the top surface T3 and the sidewall S5 of the lower semiconductor structure 103*c* are exposed after the etching process. In the present embodiment, the oxide portions 215*b*, 215*c*, and 215*d* extend higher than the top surfaces T1, T2 and T3 of the lower semiconductor structures 103*a*, 103*b* and 103*c*.

Subsequently, a plurality of upper semiconductor structures 227*a*, 227*b* and 227*c* are selectively deposited over the lower semiconductor structures 103*a*, 103*b* and 103*c*, as shown in FIG. 16 in accordance with some embodiments. In some embodiments, the upper semiconductor structures 227*a*, 227*b* and 227*c* covers the exposed surfaces of the lower semiconductor structures 103*a*, 103*b* and 103*c* after the doped regions 225*a*, 225*b* and 225*c* are removed. Some materials used to form the upper semiconductor structures

227*a*, 227*b* and 227*c* are similar to, or the same as those used to form the upper semiconductor structures 127*a*, 127*b* and 127*c* of the semiconductor device structure 100, and details thereof are not repeated herein.

Then, a dielectric layer 229 is formed covering the oxide portions 215*a*, 215*b*, 215*c* and 215*d*, and the upper semiconductor structures 227*a*, 227*b* and 227*c* are surrounded by the dielectric layer 229, as shown in FIG. 2 in accordance with some embodiments. Some materials used to form the dielectric layer 229 are similar to, or the same as those used to form the dielectric layer 129 of the semiconductor device structure 100, and details thereof are not repeated herein. After the dielectric layer 229 is formed, the semiconductor device structure 200 is obtained.

Figure 17:
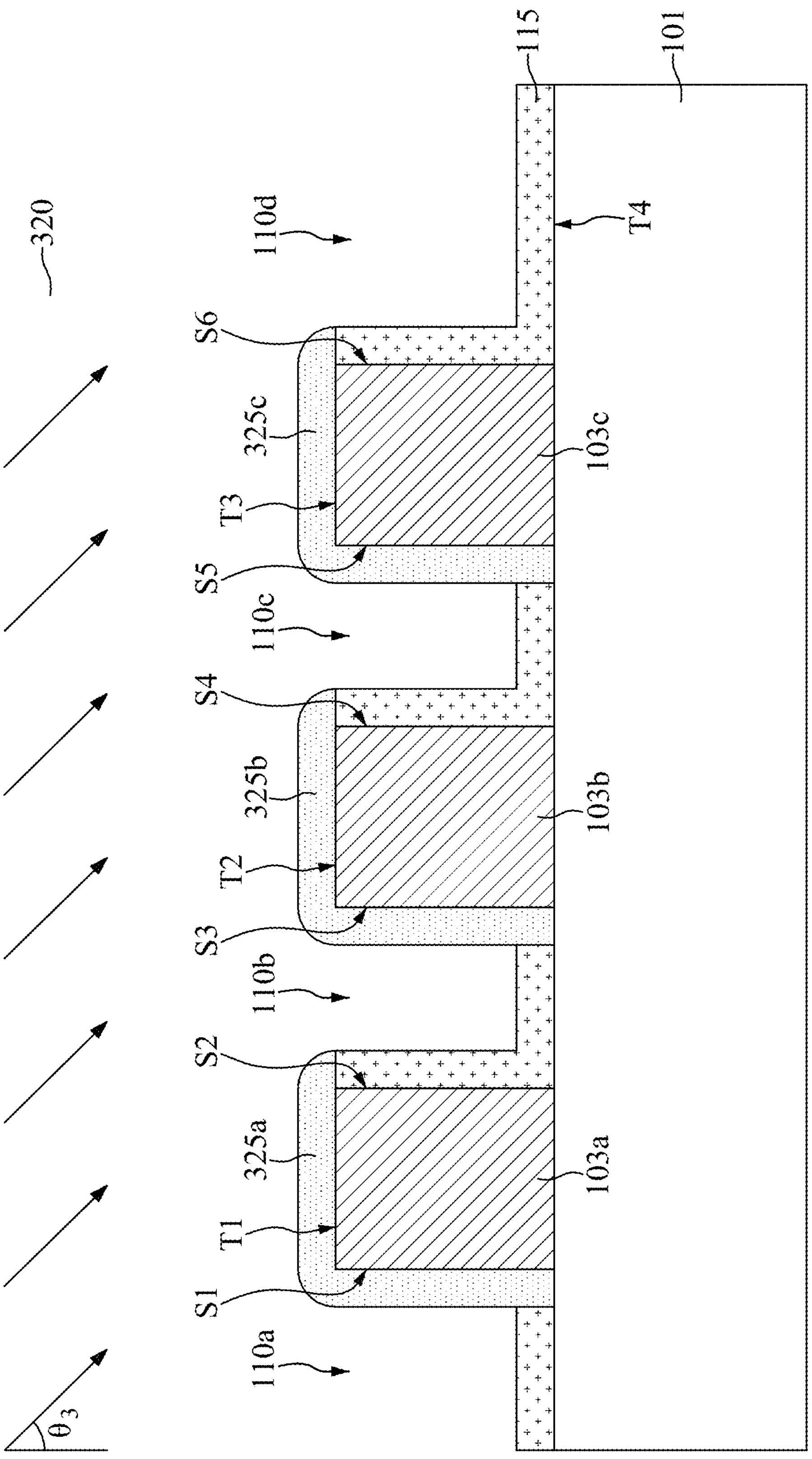
FIG. 17 is a cross-sectional view illustrating an intermediate stage of performing an ion implantation process to form a plurality of doped regions in the oxide layer during the formation of the semiconductor device structure, in accordance with some other embodiments.
Figure 18:
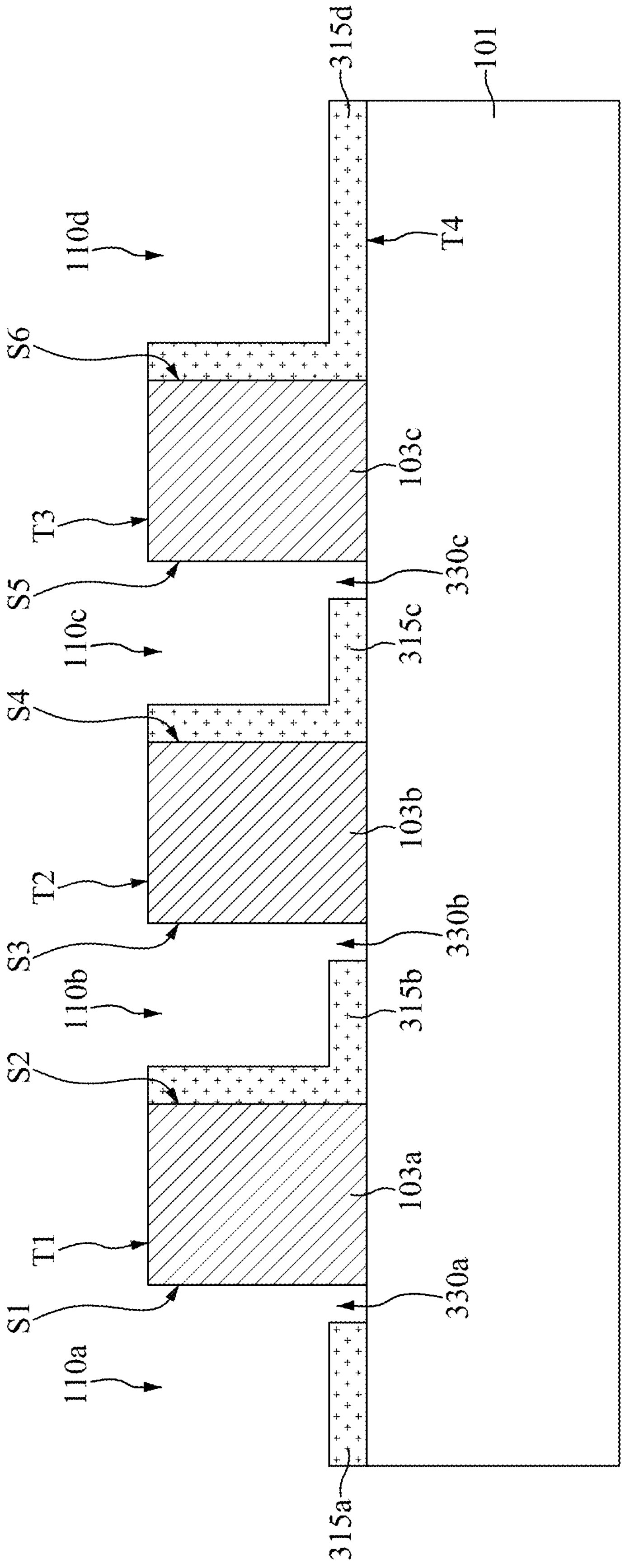
FIG. 18 is a cross-sectional view illustrating an intermediate stage of removing the doped regions such that a plurality of oxide portions remain during the formation of the semiconductor device structure, in accordance with some other embodiments.
Figure 19:
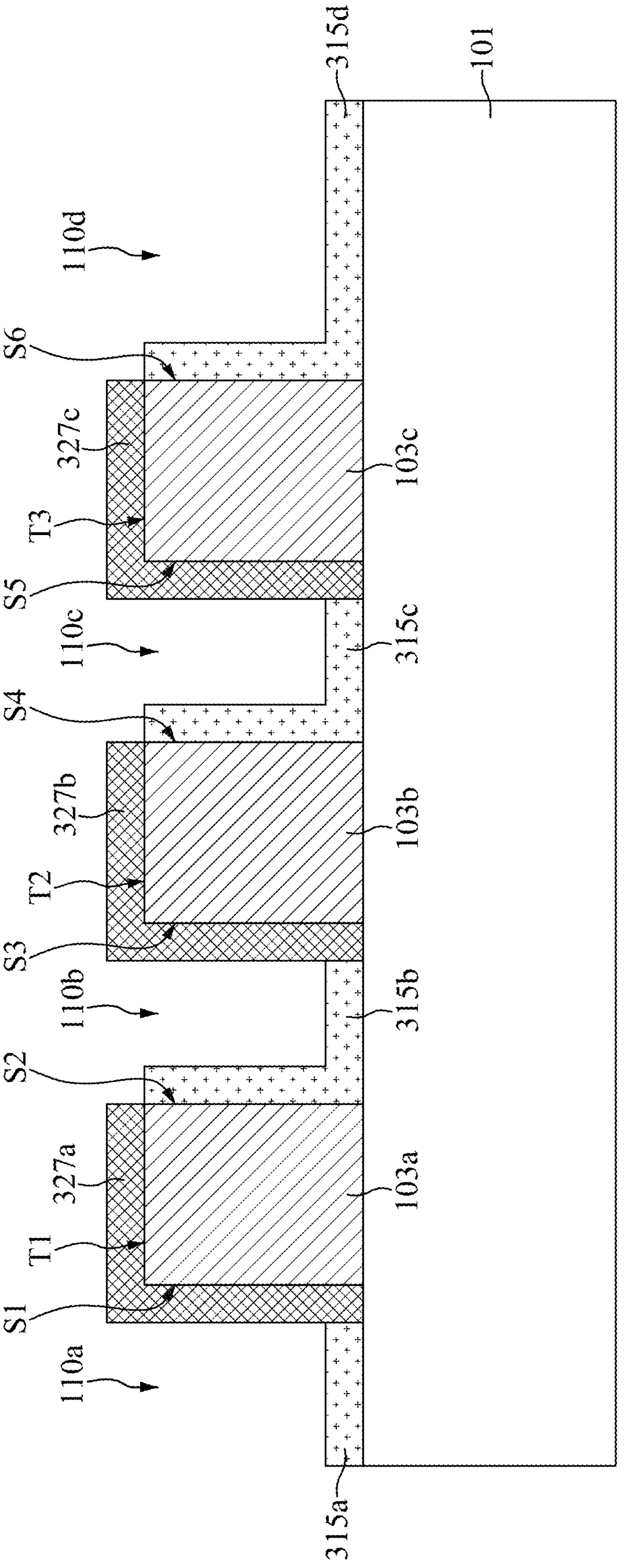
FIG. 19 is a cross-sectional view illustrating an intermediate stage of forming a plurality of upper semiconductor structures over the lower semiconductor structures during the formation of the semiconductor device structure, in accordance with some other embodiments.

FIGS. 17-19 are cross-sectional views illustrating intermediate stages of forming the semiconductor device structure 300, in accordance with some embodiments. It should be pointed out that operations for forming the semiconductor device 300 before the structure shown in FIG. 17 are substantially the same as the operations for forming the semiconductor device 100 shown in FIGS. 6-9, and the related detailed descriptions may refer to the foregoing paragraphs and are not discussed again herein.

After the oxide layer 115 is formed, an ion implantation process 320 is performed to form a plurality of doped regions 325*a*, 325*b*, and 325*c* in the oxide layer 115, as shown in FIG. 17 in accordance with some embodiments. In some embodiments, the ion implantation process 320 is performed with a tilt angle $\theta_3$. In some embodiments, the tilt angle $\theta_3$ is less than 30 degrees.

In some embodiments, the tile angle $\theta_3$ is different from the tilt angle $\theta_1$ utilized in the ion implantation process 120 and the tilt angle $\theta_2$ utilized in the ion implantation process 220. In some embodiments, the dose of the ion implantation process 320 is different from the dose of the ion implantation process 120 and the dose of the ion implantation process 220. In the present embodiment, the doped regions 325*a*, 325*b*, and 325*c* extend to direct contact the top surface T4 of the semiconductor substrate 101.

Similar to the ion implantation process 120, a P-type dopant, such as boron (B), and/or an N-type dopant, such as phosphorous (P), can be implanted to form the doped regions 325*a*, 325*b* and 325*c*, and a thermal treating process is performed after the ion implantation process 320, such that the doped regions 325*a*, 325*b* and 325*c* include PSG, BSG, or BPSG. In some embodiments, after the ion implantation process 320 is performed, the doped regions 325*a*, 325*b*, 325*c* have the same conductivity type as the lower semiconductor structures 103*a*, 103*b*, and 103*c*. In some embodiments, the portions of the oxide layer 115 covering and in direct contact with the sidewalls S2, S4 and S6 of the lower semiconductor structures 103*a*, 103*b* and 103*c* remain undoped.

Next, the doped regions 325*a*, 325*b*, 325*c* are removed by a VHF etching process such that undoped regions of the oxide layer 115 (i.e., the oxide portions 315*a*, 315*b*, 315*c*, 315*d*) remain, as shown in FIG. 18 in accordance with some embodiments. The etching process for removing the doped regions have been described in detail in the aforementioned embodiment, so that details thereof are not repeated.

In some embodiments, the top surface T1 and the sidewall S1 of the lower semiconductor structure 103*a*, the top surface T2 and the sidewall S3 of the lower semiconductor structure 103*b*, and the top surface T3 and the sidewall S5 of the lower semiconductor structure 103*c* are exposed after the etching process. In the present embodiment, a gap 330*a* is formed between the oxide portion 315*a* and the lower semiconductor structure 103*a* such that the oxide portion 315*a* is separated from the sidewall S1 of the lower semiconductor structure 103*a*, a gap 330*b* is formed between the oxide portion 315*b* and the lower semiconductor structure 103*b* such that the oxide portion 315*b* is separated from the sidewall S3 of the lower semiconductor structure 103*b*, and a gap 330*c* is formed between the oxide portion 315*c* and the lower semiconductor structure 103*c* such that the oxide portion 315*c* is separated from the sidewall S5 of the lower semiconductor structure 103*c*. In some embodiments, the top surface T4 of the semiconductor substrate 101 is partially exposed by the gaps 330*a*, 330*b* and 330*c*.

Next, a plurality of upper semiconductor structures 327*a*, 327*b* and 327*c* are selectively deposited over the lower semiconductor structures 103*a*, 103*b* and 103*c*, as shown in FIG. 19 in accordance with some embodiments. In some embodiments, the upper semiconductor structures 327*a*, 327*b* and 327*c* covers the exposed surfaces of the lower semiconductor structures 103*a*, 103*b* and 103*c* after the doped regions 325*a*, 325*b* and 325*c* are removed. Some materials used to form the upper semiconductor structures 327*a*, 327*b* and 327*c* are similar to, or the same as those used to form the upper semiconductor structures 127*a*, 127*b* and 127*c* of the semiconductor device structure 100, and details thereof are not repeated herein. In the present embodiment, the gaps 330*a*, 330*b* and 330*c* are filled by the upper semiconductor structures 327*a*, 327*b* and 327*c*, respectively.

Subsequently, a dielectric layer 329 is formed covering the oxide portions 315*a*, 315*b*, 315*c* and 315*d*, and the upper semiconductor structures 327*a*, 327*b* and 327*c* are surrounded by the dielectric layer 329, as shown in FIG. 3 in accordance with some embodiments. Some materials used to form the dielectric layer 329 are similar to, or the same as those used to form the dielectric layer 129 of the semiconductor device structure 100, and details thereof are not repeated herein. After the dielectric layer 329 is formed, the semiconductor device structure 300 is obtained.

Figure 20:
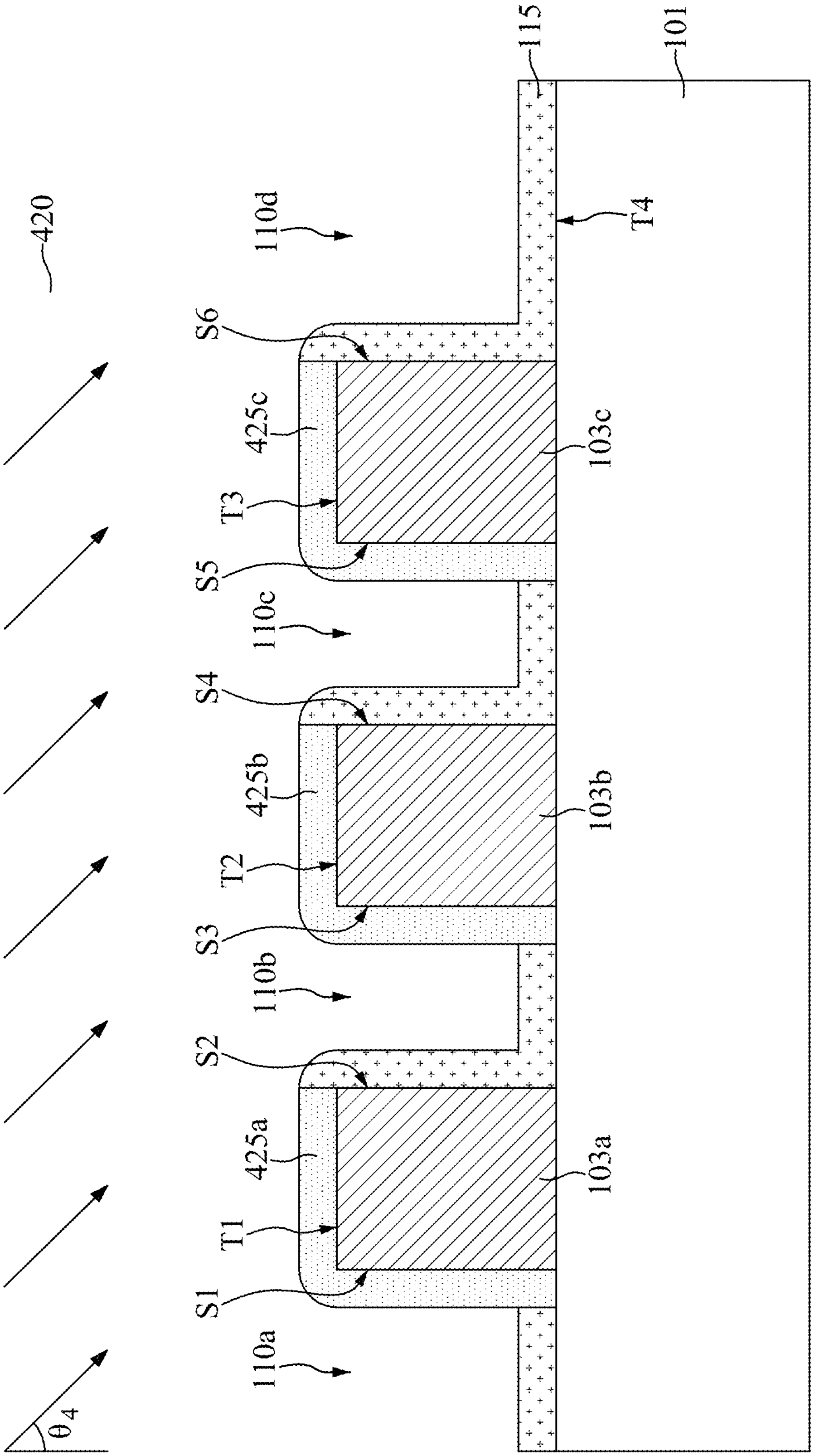
FIG. 20 is a cross-sectional view illustrating an intermediate stage of performing an ion implantation process to form a plurality of doped regions in the oxide layer during the formation of the semiconductor device structure, in accordance with some other embodiments.
Figure 21:
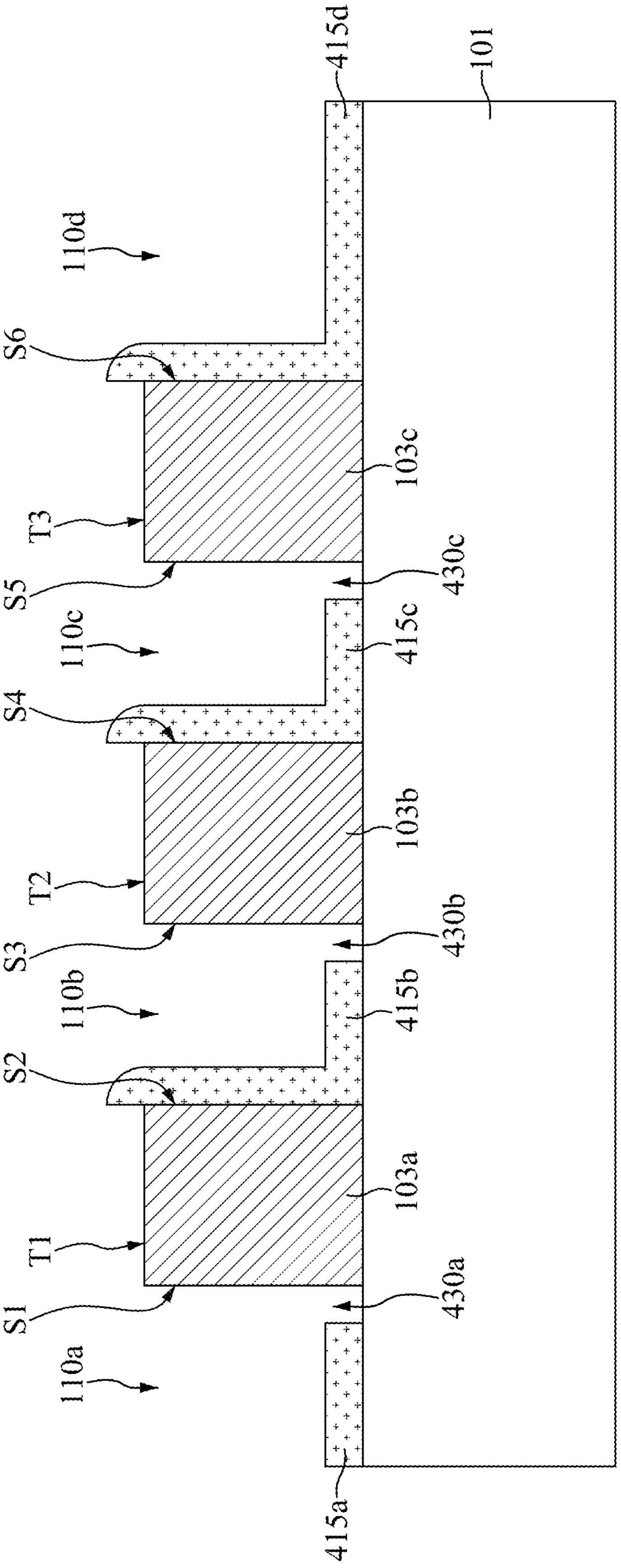
FIG. 21 is a cross-sectional view illustrating an intermediate stage of removing the doped regions such that a plurality of oxide portions remain during the formation of the semiconductor device structure, in accordance with some other embodiments.
Figure 22:
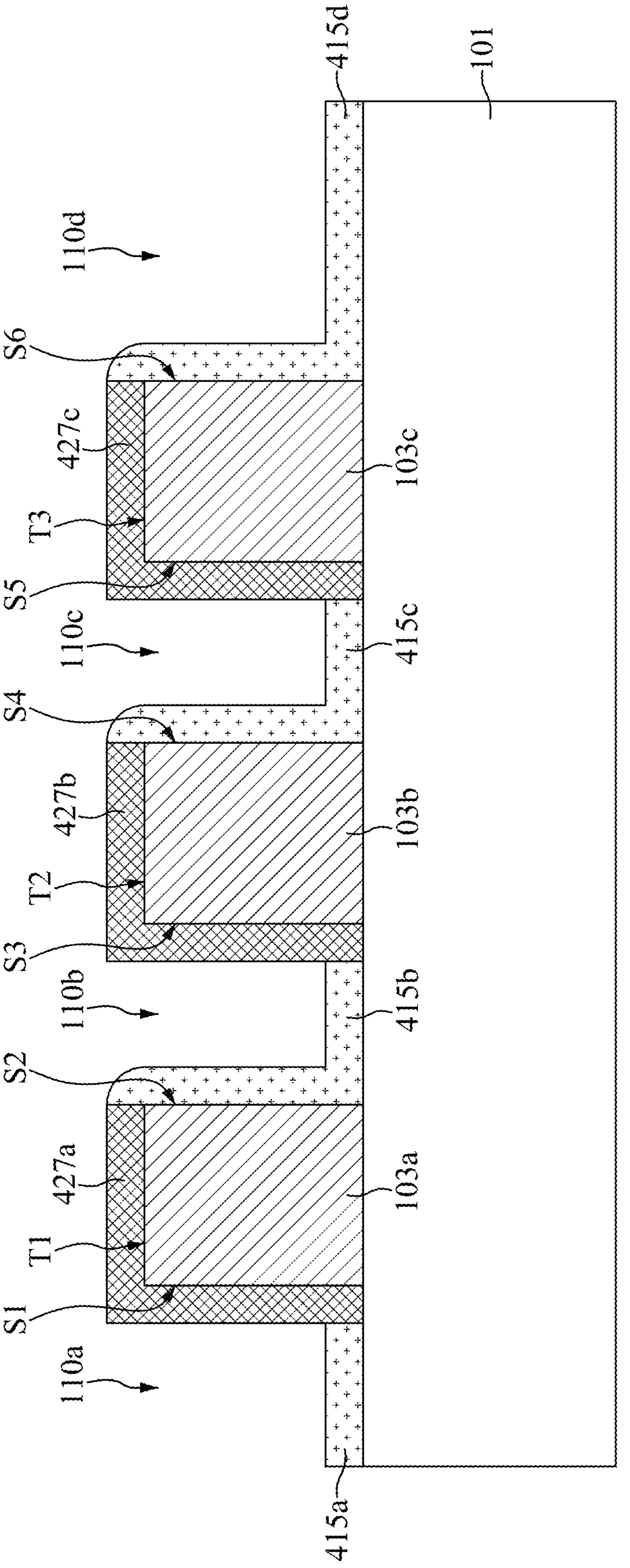
FIG. 22 is a cross-sectional view illustrating an intermediate stage of forming a plurality of upper semiconductor structures over the lower semiconductor structures during the formation of the semiconductor device structure, in accordance with some other embodiments.

FIGS. 20-22 are cross-sectional views illustrating intermediate stages of forming the semiconductor device structure 400, in accordance with some embodiments. It should be pointed out that operations for forming the semiconductor device 400 before the structure shown in FIG. 20 are substantially the same as the operations for forming the semiconductor device 100 shown in FIGS. 6-9, and the related detailed descriptions may refer to the foregoing paragraphs and are not discussed again herein.

After the oxide layer 115 is formed, an ion implantation process 420 is performed to form a plurality of doped regions 425*a*, 425*b*, and 425*c* in the oxide layer 115, as shown in FIG. 20 in accordance with some embodiments. In some embodiments, the ion implantation process 420 is performed with a tilt angle $\theta_4$. In some embodiments, the tilt angle $\theta_4$ is less than 30 degrees.

In some embodiments, the tile angle $\theta_4$ is different from the tilt angle $\theta_1$ utilized in the ion implantation process 120, the tilt angle $\theta_2$ utilized in the ion implantation process 220, and the tilt angle $\theta_3$ utilized in the ion implantation process 320. In some embodiments, the dose of the ion implantation process 420 is different from the dose of the ion implantation process 120, the dose of the ion implantation process 220, and the dose of the ion implantation process 320. In the present embodiment, the doped regions 425*a*, 425*b*, and 425*c* extend to direct contact the top surface T4 of the semiconductor substrate 101.

Similar to the ion implantation process 120, a P-type dopant, such as boron (B), and/or an N-type dopant, such as phosphorous (P), can be implanted to form the doped regions 425_a_, 425_b_ and 425_c_, and a thermal treating process is performed after the ion implantation process 420, such that the doped regions 425_a_, 425_b_ and 425_c_ include PSG, BSG, or BPSG. In some embodiments, after the ion implantation process 420 is performed, the doped regions 425_a_, 425_b_, 425_c_ have the same conductivity type as the lower semiconductor structures 103_a_, 103_b_, and 103_c_. In some embodiments, the portions of the oxide layer 115 covering and in direct contact with the sidewalls S2, S4 and S6 of the lower semiconductor structures 103_a_, 103_b_ and 103_c_ remain undoped.

Then, the doped regions 425_a_, 425_b_, 425_c_ are removed by a VHF etching process such that undoped regions of the oxide layer 115 (i.e., the oxide portions 415_a_, 415_b_, 415_c_, 415_d_) remain, as shown in FIG. 21 in accordance with some embodiments. The etching process for removing the doped regions have been described in detail in the aforementioned embodiment, so that details thereof are not repeated. In some embodiments, the top surface T1 and the sidewall S1 of the lower semiconductor structure 103_a_, the top surface T2 and the sidewall S3 of the lower semiconductor structure 103_b_, and the top surface T3 and the sidewall S5 of the lower semiconductor structure 103_c_ are exposed after the etching process.

In the present embodiment, the oxide portions 415_b_, 415_c_, and 415_d_ extend higher than the top surfaces T1, T2 and T3 of the lower semiconductor structures 103_a_, 103_b_ and 103_c_, a gap 430_a_ is formed between the oxide portion 415_a_ and the lower semiconductor structure 103_a_ such that the oxide portion 415_a_ is separated from the sidewall S1 of the lower semiconductor structure 103_a_, a gap 430_b_ is formed between the oxide portion 415_b_ and the lower semiconductor structure 103_b_ such that the oxide portion 415_b_ is separated from the sidewall S3 of the lower semiconductor structure 103_b_, and a gap 430_c_ is formed between the oxide portion 415_c_ and the lower semiconductor structure 103_c_ such that the oxide portion 415_c_ is separated from the sidewall S5 of the lower semiconductor structure 103_c_. In some embodiments, the top surface T4 of the semiconductor substrate 101 is partially exposed by the gaps 430_a_, 430_b_ and 430_c_.

Next, a plurality of upper semiconductor structures 427_a_, 427_b_ and 427_c_ are selectively deposited over the lower semiconductor structures 103_a_, 103_b_ and 103_c_, as shown in FIG. 22 in accordance with some embodiments. In some embodiments, the upper semiconductor structures 427_a_, 427_b_ and 427_c_ covers the exposed surfaces of the lower semiconductor structures 103_a_, 103_b_ and 103_c_ after the doped regions 425_a_, 425_b_ and 425_c_ are removed. Some materials used to form the upper semiconductor structures 427_a_, 427_b_ and 427_c_ are similar to, or the same as those used to form the upper semiconductor structures 127_a_, 127_b_ and 127_c_ of the semiconductor device structure 100, and details thereof are not repeated herein. In the present embodiment, the gaps 430_a_, 430_b_ and 430_c_ are filled by the upper semiconductor structures 427_a_, 427_b_ and 427_c_, respectively.

Subsequently, a dielectric layer 429 is formed covering the oxide portions 415_a_, 415_b_, 415_c_ and 415_d_, and the upper semiconductor structures 427_a_, 427_b_ and 427_c_ are surrounded by the dielectric layer 429, as shown in FIG. 4 in accordance with some embodiments. Some materials used to form the dielectric layer 429 are similar to, or the same as those used to form the dielectric layer 129 of the semiconductor device structure 100, and details thereof are not repeated herein. After the dielectric layer 429 is formed, the semiconductor device structure 400 is obtained.

Embodiments of the semiconductor device structure and method for preparing the same are provided in the disclosure. In some embodiments, the semiconductor device structure includes a composite interconnect structure having a lower semiconductor structure (e.g., the lower semiconductor structure 103_a_), and an upper semiconductor structure (e.g., the upper semiconductor structure 127_a_). The lower semiconductor structure has a first sidewall (e.g., the sidewall S1) and a second sidewall (e.g., the sidewall S2) opposite to the first sidewall. In some embodiments, the upper semiconductor structure covers the first sidewall and a top surface (e.g., the top surface T1) of the lower semiconductor structure, and the semiconductor device structure further includes an oxide portion (e.g., the oxide portion 115_b_) extending along the second sidewall of the lower semiconductor structure. In some embodiments, the lower semiconductor structure and the upper semiconductor structure include different materials, and the materials of the upper semiconductor structure and the lower semiconductor structure are selected such that the upper semiconductor structure can be selectively deposited on the exposed surfaces (i.e., the top surface and the first sidewall) of the lower semiconductor structure. Therefore, costly lithographic steps can be omitted. As a result, manufacturing cost and processing time can be reduced.

In one embodiment of the present disclosure, a semiconductor device structure is provided. The semiconductor device structure includes a first lower semiconductor structure disposed over a semiconductor substrate. The first lower semiconductor structure has a first sidewall and a second sidewall opposite to the first sidewall. The semiconductor device structure also includes a first upper semiconductor structure covering a top surface and the first sidewall of the first lower semiconductor structure. The first lower semiconductor structure and the first upper semiconductor structure include different materials. The semiconductor device structure further includes a first oxide portion disposed over the semiconductor substrate and extending along the second sidewall of the first lower semiconductor structure. The first oxide portion has an L-shape.

In another embodiment of the present disclosure, a semiconductor device structure is provided. The semiconductor device structure includes a first lower semiconductor structure disposed over a semiconductor substrate. The first lower semiconductor structure has a first sidewall and a second sidewall opposite to the first sidewall. The semiconductor device structure also includes a first upper semiconductor structure covering a top surface and the first sidewall of the first lower semiconductor structure. The first lower semiconductor structure and the first upper semiconductor structure include different materials. The semiconductor device structure further includes a first oxide portion disposed over the semiconductor substrate and extending along the second sidewall of the first lower semiconductor structure, and a dielectric layer disposed over the first oxide portion. The first oxide portion separates the dielectric layer from the semiconductor substrate.

In yet another embodiment of the present disclosure, a method for preparing a semiconductor device structure is provided. The method includes forming a first lower semiconductor structure over a semiconductor substrate. The first lower semiconductor structure has a first sidewall and a second sidewall opposite to the first sidewall. The method also includes depositing an oxide layer covering the first sidewall, the second sidewall, and a top surface of the first lower semiconductor structure. The method further includes performing an ion implantation process to form a first doped region in the oxide layer. The first sidewall and the top surface of the first lower semiconductor structure are covered by the first doped region. The method further includes removing the first doped region such that a first oxide portion remains on the second sidewall of the first lower semiconductor structure, and forming a first upper semiconductor structure covering the first sidewall and the top surface of the first lower semiconductor structure after the first doped region is removed.

The embodiments of the present disclosure have some advantageous features. In some embodiments, the semiconductor device structure includes a composite interconnect structure having an upper semiconductor structure and a lower semiconductor structure, and an oxide portion and the upper semiconductor structure are formed on opposite sidewalls of the lower semiconductor structure. The materials of the upper semiconductor structure and the lower semiconductor structure are selected such that the upper semiconductor structure can be selectively deposited on the exposed surfaces of the lower semiconductor structure. Therefore, costly lithographic steps can be omitted. As a result, manufacturing cost and processing time can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:

a first lower semiconductor structure disposed on and in direct contact with a top surface of a semiconductor substrate, wherein the first lower semiconductor structure has a first sidewall and a second sidewall opposite to the first sidewall, wherein the first sidewall and the second sidewall of the first lower semiconductor structure are parallel with each other;

a first upper semiconductor structure covering a top surface and the first sidewall of the first lower semiconductor structure, wherein the first lower semiconductor structure and the first upper semiconductor structure comprise different materials;

a first oxide portion disposed over the semiconductor substrate and extending along the second sidewall of the first lower semiconductor structure;

a dielectric layer disposed over the first oxide portion, wherein the first oxide portion separates the dielectric layer from the semiconductor substrate;

a second lower semiconductor structure disposed on and in direct contact with the top surface of the semiconductor substrate, wherein the second lower semiconductor structure has a third sidewall facing the second sidewall of the first lower semiconductor structure and a fourth sidewall opposite to the third sidewall, wherein the third sidewall and the fourth sidewall of the second lower semiconductor structure are parallel with each other;

a second upper semiconductor structure covering a top surface and the third sidewall of the second lower semiconductor structure; and a second oxide portion disposed over the semiconductor substrate and extending along the fourth sidewall of the second lower semiconductor structure, wherein the second oxide portion is covered by the dielectric layer;

wherein the first oxide portion is in direct contact with a sidewall of the second upper semiconductor structure and is in direct contact with the top surface of the semiconductor substrate;

wherein the second oxide portion is in direct contact with the top surface of the semiconductor substrate;

wherein a sidewall of the first upper semiconductor structure is aligned with the first sidewall of the first lower semiconductor structure;

wherein a sidewall of the second upper semiconductor structure is aligned with the fourth sidewall of the second lower semiconductor structure;

wherein a material of the first oxide portion is the same as a material of the second oxide portion.

2. The semiconductor device structure of claim 1, wherein the first upper semiconductor structure is in direct contact with the top surface and the first sidewall of the first lower semiconductor structure, and wherein the first oxide portion is in direct contact with the second sidewall of the first lower semiconductor structure;

wherein the second oxide portion is in direct contact with the fourth sidewall of the second lower semiconductor structure;

wherein a top surface of the first oxide portion, a top surface of the second oxide portion, the top surface of the first lower semiconductor structure, and the top surface of the second lower semiconductor structure are coplanar with each other, such that the first oxide portion does not contact the first upper semiconductor structure and the second oxide portion does not contact the second upper semiconductor structure.

3. The semiconductor device structure of claim 1, wherein the first lower semiconductor structure and the dielectric layer are separated by the first upper semiconductor structure and the first oxide portion;

wherein a top surface of the first oxide portion is extended above the top surface of the first lower semiconductor structure, such that the first oxide portion is in contact with the first upper semiconductor structure;

wherein a top surface of the second oxide portion is extended above the top surface of the second lower semiconductor structure, such that the second oxide portion is in contact with the second upper semiconductor structure.

4. The semiconductor device structure of claim 1, wherein the first lower semiconductor structure comprises doped polysilicon, and the first upper semiconductor structure comprises germanium (Ge).

5. The semiconductor device structure of claim 1, wherein a bottom surface of the first upper semiconductor structure is higher than a bottom surface of the first lower semiconductor structure;

wherein a bottom surface of the second upper semiconductor structure is higher than a bottom surface of the second lower semiconductor structure;

wherein the first oxide portion is in direct contact between the bottom surface of the second upper semiconductor structure and the top surface of the semiconductor substrate.

6. The semiconductor device structure of claim 1, wherein a bottom surface of the first upper semiconductor structure, a bottom surface of the second upper semiconductor structure, a bottom surface of the first lower semiconductor structure, and a bottom surface of the second lower semiconductor structure are coplanar with each other, wherein the bottom surface of the first upper semiconductor structure is in direct contact with the top surface of the semiconductor substrate;

wherein the bottom surface of the second upper semiconductor structure is in direct contact with the top surface of the semiconductor substrate.

* * * * *